US006972578B2

(12) United States Patent
Martens et al.

(10) Patent No.: US 6,972,578 B2
(45) Date of Patent: Dec. 6, 2005

(54) METHOD AND SYSTEM FOR COMPENSATING THERMALLY INDUCED MOTION OF PROBE CARDS

(75) Inventors: Rod Martens, Livermore, CA (US); Benjamin N. Eldridge, Danville, CA (US); Gary W. Grube, Pleasanton, CA (US); Ken S. Matsubayashi, Fremont, CA (US); Richard A. Larder, Livermore, CA (US); Makarand Shinde, Dublin, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/159,560

(22) Filed: May 31, 2002

(65) Prior Publication Data

US 2003/0085723 A1 May 8, 2003

Related U.S. Application Data

(63) Continuation-in-part of application No. 10/034,412, filed on Dec. 27, 2001, which is a continuation-in-part of application No. 10/003,012, filed on Nov. 2, 2001.

(51) Int. Cl.[7] .................................... G01R 31/00
(52) U.S. Cl. .................................... 324/754; 324/158.1
(58) Field of Search .................................... 324/754, 755, 324/761, 762, 158.1, 73.1, 756, 758; 439/482; 310/309, 321, 338; 73/514.32, 105, 862.51

(56) References Cited

U.S. PATENT DOCUMENTS

| | | | | |
|---|---|---|---|---|
| 3,963,985 A | | 6/1976 | Geldermans | |
| 4,755,747 A | | 7/1988 | Sato | |
| 4,780,836 A | | 10/1988 | Miyazaki et al. | |
| 5,124,639 A | | 6/1992 | Carlin et al. | |
| 5,521,523 A | | 5/1996 | Kimura et al. | |
| 5,550,480 A | | 8/1996 | Nelson et al. | |
| 5,604,446 A | * | 2/1997 | Sano | 324/758 |
| 5,640,101 A | | 6/1997 | Kuji et al. | |
| 5,861,759 A | | 1/1999 | Bialobrodski et al. | |
| 5,936,418 A | * | 8/1999 | Ideta et al. | 324/755 |
| 5,974,662 A | | 11/1999 | Eldridge et al. | |
| 6,064,215 A | | 5/2000 | Kister | |
| 6,137,299 A | * | 10/2000 | Cadieux et al. | 324/757 |
| 6,140,828 A | | 10/2000 | Iino et al. | |
| 2003/0085724 A1 | | 5/2003 | Mathieu | |
| 2003/0087523 A1 | | 5/2003 | Martens et al. | |

FOREIGN PATENT DOCUMENTS

| | | | |
|---|---|---|---|
| EP | 1098200 A2 | | 5/2001 |
| JP | 61-150346 | | 7/1986 |
| JP | 04-333250 | | 11/1992 |
| JP | 04-361543 | | 12/1992 |
| JP | 05-264590 | | 10/1993 |
| JP | 409005358 A | * | 1/1997 |
| JP | 11-051972 | | 2/1999 |

* cited by examiner

*Primary Examiner*—Vinh P. Nguyen
(74) *Attorney, Agent, or Firm*—N. Kenneth Burraston

(57) ABSTRACT

The present invention discloses a method and system compensating for thermally induced motion of probe cards used in testing die on a wafer. A probe card incorporating temperature control devices to maintain a uniform temperature throughout the thickness of the probe card is disclosed. A probe card incorporating bi-material stiffening elements which respond to changes in temperature in such a way as to counteract thermally induced motion of the probe card is disclosed including rolling elements, slots and lubrication. Various means for allowing radial expansion of a probe card to prevent thermally induced motion of the probe card are also disclosed. A method for detecting thermally induced movement of the probe card and moving the wafer to compensate is also disclosed.

14 Claims, 31 Drawing Sheets

METHOD AND SYSTEM FOR COMPENSATING THERMALLY INDUCED MOTION OF PROBE CARDS

This application is a continuation in part of application Ser. No. 10/034,412 filed Dec. 27, 2001 entitled METHOD AND SYSTEM FOR COMPENSATING THERMALLY INDUCED MOTION OF PROBE CARDS which is a continuation in part of application Ser. No. 10/003,012 filed Nov. 2, 2001.

BACKGROUND OF THE INVENTION

The present invention relates to probe cards having electrical contacts for testing integrated circuits, and more specifically for a system and method to compensate for thermally induced motion of such probe cards. Probe cards are used in testing a die, e.g. integrated circuit devices, typically on wafer boards. Such probe cards are used in connection with a device known as a tester (sometimes called a prober) wherein the probe card is electronically connected to the tester device, and in turn the probe card is also in electronic contact with the integrated circuit to be tested.

Typically the wafer to be tested is loaded into the tester securing it to a movable chuck. During the testing process, the chuck moves the wafer into electrical contract with the probe card. This contact occurs between a plurality of electrical contacts on the probe card, typically in the form of microsprings, and plurality of discrete connection pads (bond pads) on the dies. Several different types of electrical contacts are known and used on probe cards, including without limitation needle contacts, cobra-style contacts, spring contacts, and the like. In this manner, the semiconductor dies can be tested and exercised, prior to singulating the dies from the wafer.

For effective contact between the electrical contacts of the probe card and the bond pads of the dies, the distance between the probe card and the wafer should be carefully maintained. Typical spring contacts such as those disclosed in U.S. Pat. Nos. 6,184,053 B1, 5,974,662 and 5,917,707, incorporated herein by reference, are approximately 0.040", or about one millimeter, in height. If the wafer is too far from the probe card contact between the electrical contacts and the bond pads will be intermittent if at all.

While the desired distance between the probe card and wafer may be more easily achieved at the beginning of the testing procedure, the actual distance may change as the testing procedure proceeds, especially where the wafer temperature differs from the ambient temperature inside the tester. In many instances, the wafer being tested may be heated or cooled during the testing process. Insulating material such as platinum reflectors may be used to isolate the effects of the heating or cooling process to some extent, but it cannot eliminate them entirely. When a wafer of a temperature greater than that of the probe card is moved under the card, the card face nearest the wafer begins to change temperature. Probe cards are typically built of layers of different materials and are usually poor heat conductors in a direction normal to the face of the card. As a result of this a thermal gradient across the thickness of the probe card can appear rapidly. The probe card deflects from uneven heat expansion. As a result of this uneven expansion, the probe card begins to sag, decreasing the distance between the probe card and the wafer. The opposite phenomenon occurs when a wafer is cooler than the ambient temperature of the tester is placed near the probe card. As the face of the probe card nearest the wafer cools and contracts faster than the face farthest from the wafer, the probe card begins to bow away from the wafer disrupting electrical contact between the wafer and the probe card.

SUMMARY OF THE INVENTION

The invention is set forth in the claims below, and the following is not in any way to limit, define or otherwise establish the scope of legal protection. In general terms, the present invention relates to a method and system from compensating for thermally or otherwise induced motion of probe cards during testing of integrated circuits. This may include optional features such as energy transmissive devices, bi-material deflecting elements, and/or radial expansion elements.

One object of the present invention is to provide an improved method and system for compensating thermally induced motion of probe cards.

Further objects, embodiments, forms, benefits, aspects, features and advantages of the present invention may be obtained from the present disclosure.

DETAILED DESCRIPTION OF THE INVENTION

Figure 1:
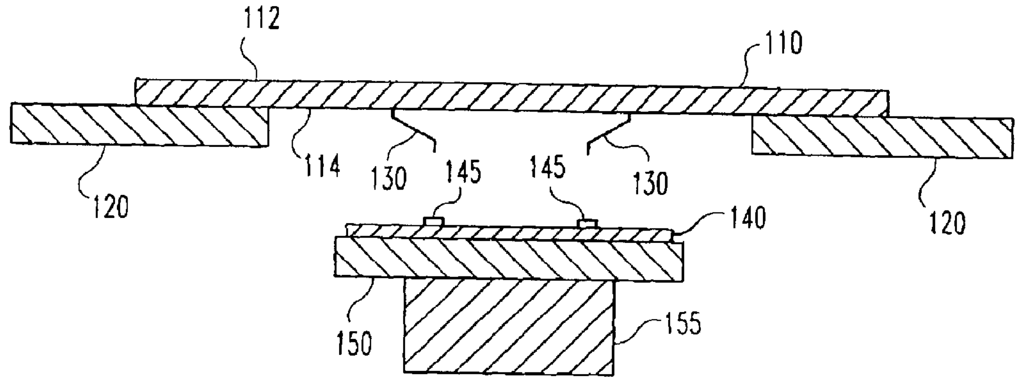
FIG. 1 is a cross-sectional view of a probe card.

For the purposes of promoting an understanding of the principles of the invention, reference will now be made to the embodiments illustrated in the drawings and specific language will be used to describe the same. It will nevertheless be understood that no limitation of the scope of the invention is thereby intended, and alterations and modifications in the illustrated device and method and further applications of the principles of the invention as illustrated therein, are herein contemplated as would normally occur to one skilled in the art to which the invention relates.

FIG. 1 shows a typical example of a probe card 110 and wafer 140 loaded into a tester. In this and the other accompanying views certain elements of certain components are shown exaggerated, for illustrative clarity. Additional components which may be mounted to the probe card, such as active and passive electronic components, connectors, and the like, are omitted for clarity. The present invention may be practiced with variations of the basic probe card design examples shown, such as probe cards incorporating interposers as shown in U.S. Pat. No. 5,974,662, which is hereby incorporated by reference. No limitation of the scope of the invention is intended by the omission of these elements.

The probe card 110 is supported by the head plate 120 when mounted in the tester parallel to the die on a wafer 140, and most typically positioned directly above it. The probe card 110 is typically round, having a diameter on the order of 12 inches, although other sizes and shapes are also contemplated. The probe card 110 is generally a conventional circuit board substrate having a plurality (two of many shown) of electrical contacts 130 disposed on the wafer side 114 thereof. The electrical contacts are known in the industry and hereinafter referred to as "probes" or "probe elements". A preferred type of probe element is spring contacts, examples of which are disclosed in U.S. Pat. Nos. 6,184,053 B1; 5,974,662; and 5,917,707 which are hereby incorporated by reference. However, many other contacts are known in the industry (e.g., needle contacts and cobra-style contacts) and any such contact may be included in any embodiment of the probe cards of the present invention. Typically, the probe card is connected to the testing machine by other electrical contacts (not shown).

As is known, a semiconductor wafer 140 includes a plurality of die sites (not shown) formed by photolithography, deposition, diffusion, and the like, on its front (upper, as viewed) surface. Each die site typically has a plurality (two of many shown) of bond pads 145, which may be disposed at any location and in any pattern on the surface of the die site. Semiconductor wafers typically have a diameter of at least 6 inches, but the use of the present invention to test wafers of other sizes and shapes is also contemplated.

Once the wafer 140 is mounted in the testing device, wafer chuck 150 including table actuator 155 lift the integrated wafer 140 vertically in the Z-axis direction (see FIG. 2) to allow electronic contact between probes 130 and a corresponding pad (such as pads 145) of the wafer 140. The lifting mechanism may utilize a scissors mechanism, telescoping action, lever action, thread action, cam action or other lifting mechanisms. Such lifting mechanism, as with the other movements in the other embodiments, may be actuated by a variety of mechanisms such as pneumatics, stepper motors, servo motors or other electrical motors or otherwise and are typically robotically controlled. Such lifting mechanism may also allow for movement in the X and Y directions, tilt, and rotation. Once the wafer 140 is moved into electrical contact with the probe card 110 (as shown in FIG. 2), the testing procedure may proceed.

Figure 2:
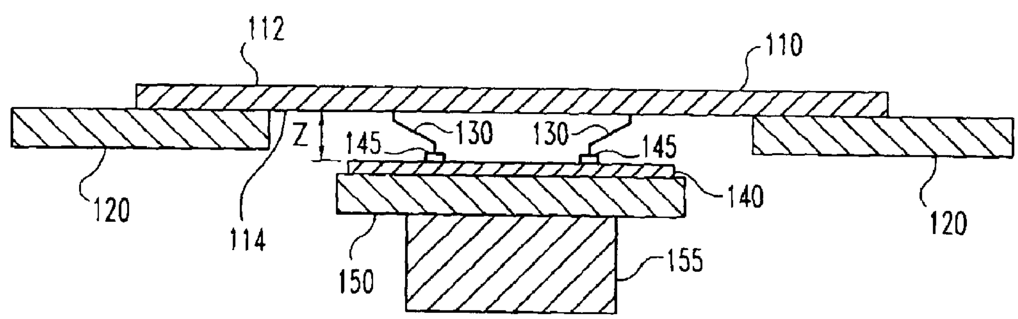
FIG. 2 is a cross-sectional view of a probe card engaged with a wafer.

FIG. 2 illustrates a wafer 140 in electrical contact with a probe card 110. The pressure contact of the probe elements 130 with the bond pads 145 provide this contact. For this contact to be produced, the wafer 140 is urged to an effective distance Z (vertical as shown) from the probe card. Typically, the height of the probes 130 used in the probe card is approximately 0.040", or about one millimeter, although probe card contacts of other heights are also contemplated by the present invention. As the probes 130 are generally somewhat flexible, the effective distance Z between the probe card 110 and the wafer 140 may differ from the height of the probes 130 being used. Of course the present invention naturally may be modified in accordance with the particular height or type of a particular probe card's electrical contacts.

Figure 2A:
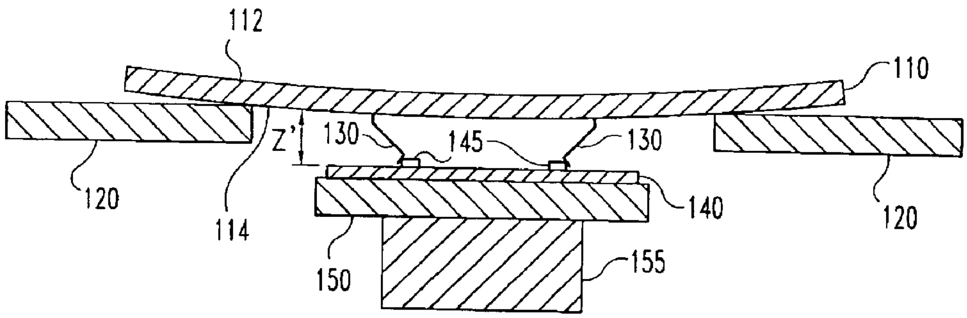
FIG. 2A is a cross-sectional view of a thermally distorted probe card engaged with a wafer.
Figure 2B:
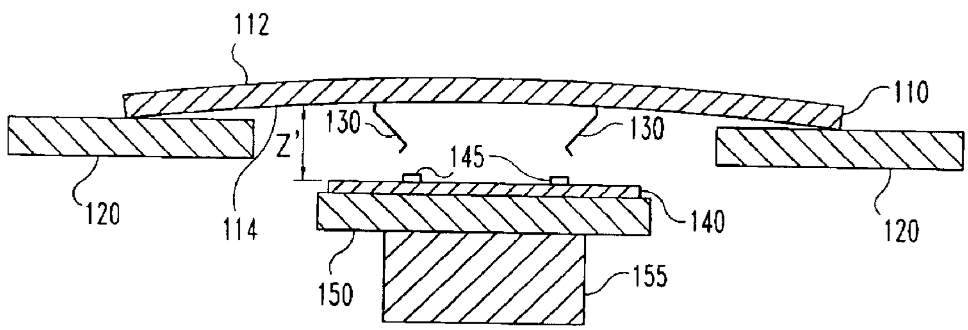
FIG. 2B is a cross-sectional view of a thermally distorted probe card engaged with a wafer.

FIGS. 2A and 2B illustrate the thermally induced motion of probe cards the present invention is directed towards. As shown in FIG. 2A, a wafer 140 having a temperature greater than the ambient temperature of the tester is engaged with the probe card 110. The card face nearest the wafer 114 begins to change temperature. As probe card assemblies are typically poor conductors of heat in a direction normal to the face of the card, a thermal gradient rapidly develops across the thickness of the probe card. The probe card behaves as a bimetallic element as the face nearest the wafer 114 warms and therefore expands more quickly than the face farthest from the wafer 112. As a result of this uneven expansion the probe card begins to sag. This movement decreases the actual distance Z' between the probe card 110 and the wafer 140 to something less than the optimal effective distance. Decreasing the distance between the probe card 10 and the wafer 140 may result in movement of the probes 130 leading to overengagement of the probes 130 from the bond pads 145 and possibly deformation or even breaking the probe elements 130 or the semiconductor device being tested.

The opposite phenomenon occurs when a wafer 140 significantly cooler than the ambient temperature of the tester is placed near the probe card 130. As the face of the probe card nearest the wafer 114 cools it begins to contract faster than the face farthest from the wafer 112. As a result of this uneven cooling, the probe card 110 begins to bow away from the wafer creating an actual distance Z' between the wafer 140 and the probe card 110 greater than the optimal effective distance. If great enough this bow may disrupt electrical contact between the wafer 140 and the probe card 110 by disengaging some of the probes 130 from their corresponding bond pads 145.

Figure 3:
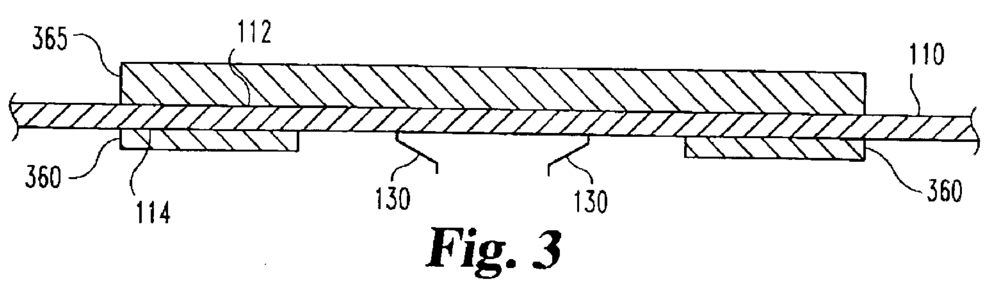
FIG. 3 is a cross-sectional view of a probe card assembly.

As seen in FIG. 3, one solution to the problem of thermally induced or other motion of probe cards known in the art is the addition of stiffening elements 360, 365 to the probe card 110. Typically circular and made of metal, both wafer side stiffeners 360 and tester side stiffeners 365 are commonly employed. These stiffeners may be affixed in any suitable manner, such as with screws (not shown) extending through corresponding holes (not shown) through the probe card 110, thereby capturing the probe card 110 securely between the wafer side stiffener 360 and tester side stiffener 365. The stiffeners may also be individually mounted directly to the probe card 110 such as with screws (not shown). The use of stiffeners, however, may also lead to thermally induced movement of the probe card. As the metal stiffeners conduct heat better than the probe card 110, a thermal gradient can appear causing the metal stiffener on one side of the probe card 110 to expand more than the metal stiffener on the other side of the probe card 110.

Figure 4:
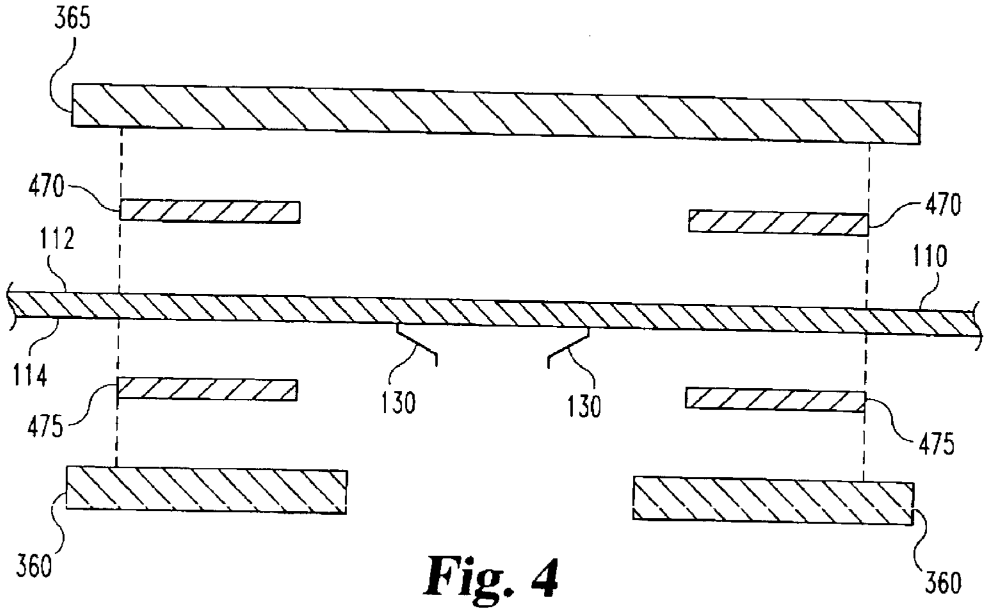
FIG. 4 is an exploded, cross-sectional view of a probe card according to one example of the present invention.
Figure 4A:
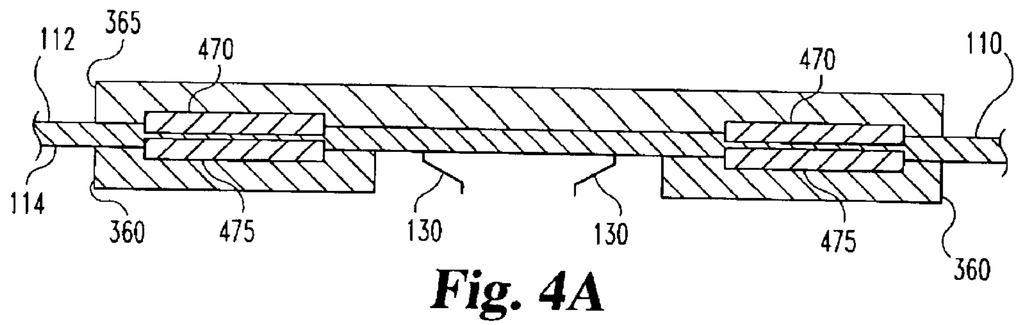
FIG. 4A is a cross-sectional view of the probe card of FIG. 4.
Figure 4B:
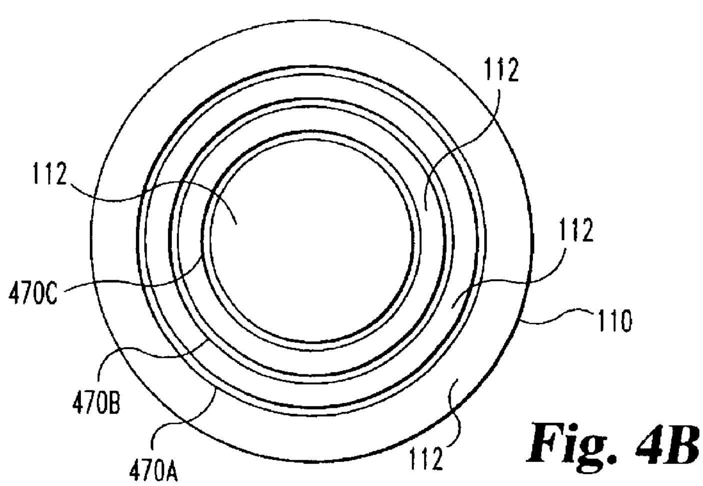
FIG. 4B is a top plan view of another example of a probe card according to the present invention.

FIG. 4 shows an exploded, cross-sectional view of one example of the present invention. Although certain elements have been exaggerated for clarity, the dashed lines in the figure properly indicate the alignment of the various components. This example is a probe card assembly incorporating at least one energy transmissive device 470, 475 to compensate for thermally induced motion of the probe card. At least one such energy transmissive element 470, 475 is disposed between the probe card 110 and the stiffening elements 360, 365. In an another example of the present invention, two such energy transmissive devices 470, 475 are utilized, preferably one adjacent to the tester side of the probe card 112 and one adjacent to the wafer side of the probe card 114. These energy transmissive devices 470, 475 may be embedded in the stiffeners 360, 365 as shown, but this is not necessary. In yet another example of the present invention, a plurality of energy transmissive elements 470A, 470B, 470C (FIG. 4B) are disposed between the probe card 110 and the stiffening elements 360, 365. Preferably this plurality of energy transmissive elements is arranged in a generally circular pattern. Also, the individual elements of the plurality of energy transmissive devices may be operably linked so they may be controlled together. The present invention also contemplates the use of a plurality of energy transmissive elements where the individual elements are generally triangular and arranged generally forming a circle. The individual elements may also be generally ring shaped and arranged generally as concentric rings as seen in FIG. 4B. The present invention also contemplates a combination of generally triangular and ring shaped individual energy transmissive elements.

Any suitable energy transmissive device may be utilized to practice this particular example of the present invention. For example, thermal elements such as thin film resistance control devices are particularly suited to the present invention. Thermal elements which allow for both heating and cooling such as devices which absorb or give off heat at the electrical junction of two different metals (i.e. a Peltier device) may also be used. Energy transmissive devices which do not rely on thermal energy are also contemplated by the present invention. Devices which generate a mechanical force when a voltage is applied (i.e. a piezoelectric device) may also be used.

Energy transmissive devices 470, 475 which are thermal control elements may be utilized to compensate for thermally induced motion of the probe card 110 in several ways. For example, the temperature control devices may be operated continually at the ambient temperature of the tester or at some other preselected temperature. This would tend to drive the probe card 110 to a uniform temperature regardless of the temperature of the wafer 140 and thereby prevent deformation of the probe card 110. Alternatively, the temperature control elements 470, 475 may incorporate a temperature sensing element (not shown). By sensing the temperature of the two sides 112, 114 of the probe card, the temperature control elements 470, 475 may be directed to apply or remove heat as required to compensate for any thermal gradient developing within the probe card 110. It is understood that the control methods described hereinabove while making reference to an example of the present invention incorporating two temperature control elements 470, 475 are equally applicable to alternate examples employing a single temperature control device or a plurality of control devices.

Energy transmissive devices 470, 475 according to the present invention may also be operated by monitoring conditions of the probe card 110 other than temperature. For example, a device such as a camera, laser, or other suitable means may be used to monitor the actual distance Z' (see FIG. 2A) between the probe card 110 and the wafer 140. When this distance differs from the optimal distance Z by a preselected amount, the energy transmissive devices 470, 475 are engaged to correct this deviation. A logic loop control as described in the discussion of FIG. 10 may also be used. The present invention also contemplates the use of energy transmissive devices 470, 475 similar to those shown to control the temperature of elements which hold or support the probe card 110 such as head plate 120 as seen in FIG. 1.

Figure 5:
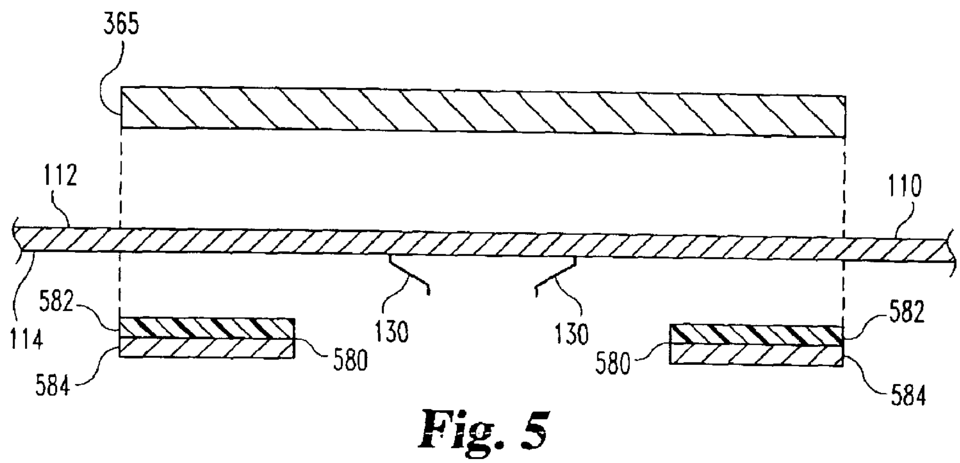
FIG. 5 is an exploded, cross-sectional view of a probe card according to another example of the present invention.
Figure 5A:
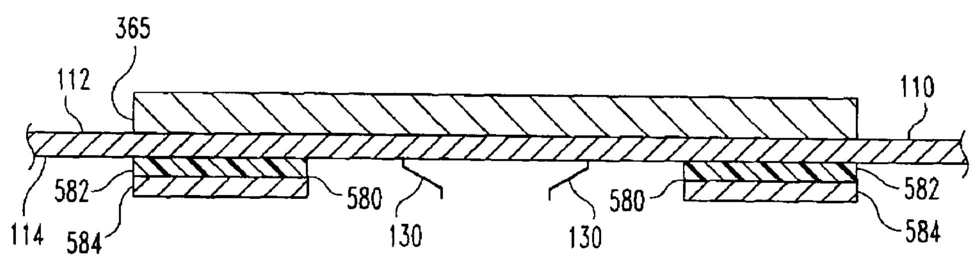
FIG. 5A is a cross-sectional view of the probe card of FIG. 5.

Referring to FIG. 5, this drawing shows an alternate example of the present invention utilizing a bi-material stiffening element 580 to compensate for thermally induced motion of the probe card 110. Although certain elements have been exaggerated for clarity, the dashed lines in the figure properly indicate the alignment of the various components. The materials used in the bi-material stiffening element preferably expand at different rates to the input of energy. For example, the upper material 582 may have a different coefficient of thermal expansion than the lower material 584 such that the two materials will react to temperature changes at different rates. Typically the layers of the bi-material stiffening element will be composed of two metals having different coefficients of thermal expansion although other materials such as ceramics and plastics may also be used. Preferably the bi-material stiffening element is located at or near the perimeter of the probe card, but other configurations are also contemplated. The materials and the thickness of the materials are chosen such that the bow created in the bi-material stiffening element 580 counteracts the expected bow of the probe card 110 for a particular application. For example, if the wafer 140 (which is typically located below the probe card 110 as shown in FIG. 2) is to be heated to a temperature greater than the ambient temperature of the tester, the bi-material stiffening element 580 would be selected such that the upper material 582 would have a greater coefficient of thermal expansion than the lower material 584. This would cause the upper material 582 to expand more rapidly than the lower material 584 giving the bi-material stiffening element 580 an upward bow to counteract the expected bow of the probe card 110 (as shown in FIG. 2A). Although not shown in FIG. 5, the present invention also contemplates the use of bi-material stiffening elements in place of the tester side stiffening element 365 as well as the use of multiple bi-material stiffening elements in the place of a single bi-material stiffening element. Additionally, the bi-material stiffening elements of the present invention may be attached to the probe card 110 by means described hereinabove for the attachment of stiffening elements to probe cards or by any other suitable method. The present invention also contemplates the use of a bi-material stiffener such that the probe card 110 is disposed between the layers of the bi-material stiffener.

Figure 6:
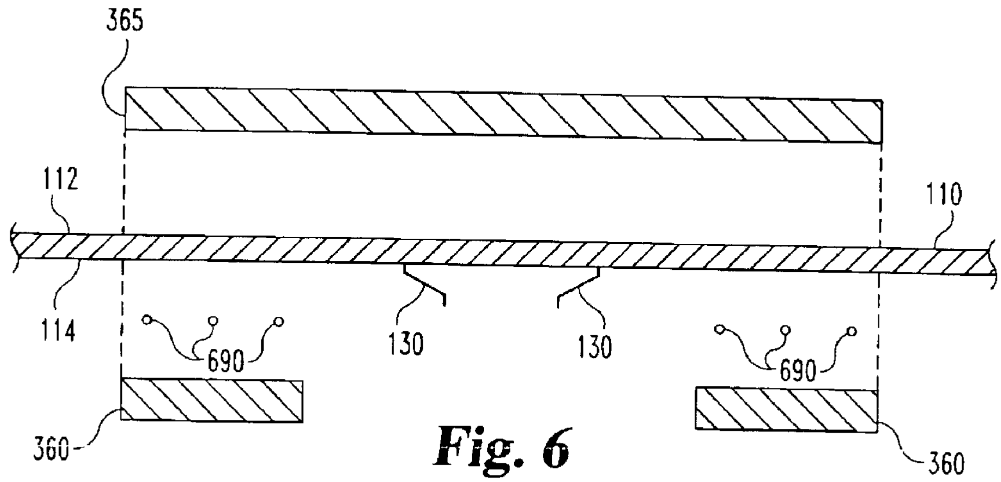
FIG. 6 is an exploded, cross-sectional view of a probe card according to another example of the present invention.
Figure 6A:
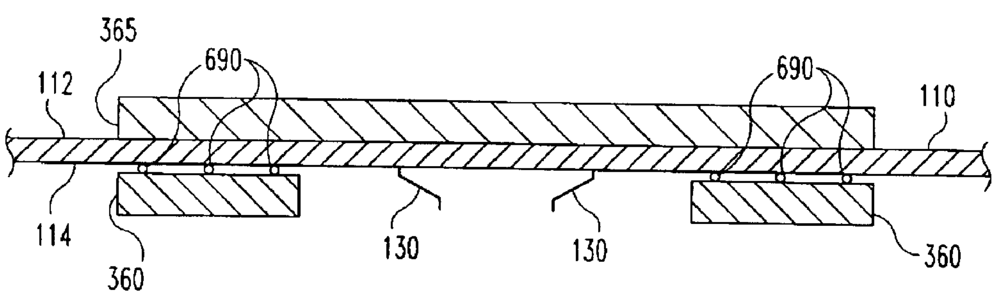
FIG. 6A is a cross-sectional view of the probe card of FIG. 6.
Figure 7:
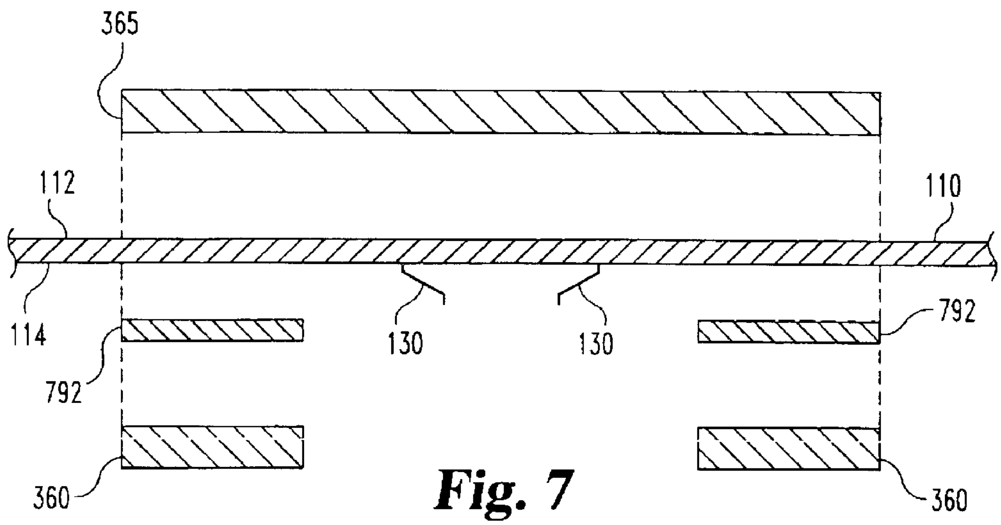
FIG. 7 is an exploded, cross-sectional view of a probe card according to another example of the present invention.
Figure 7A:
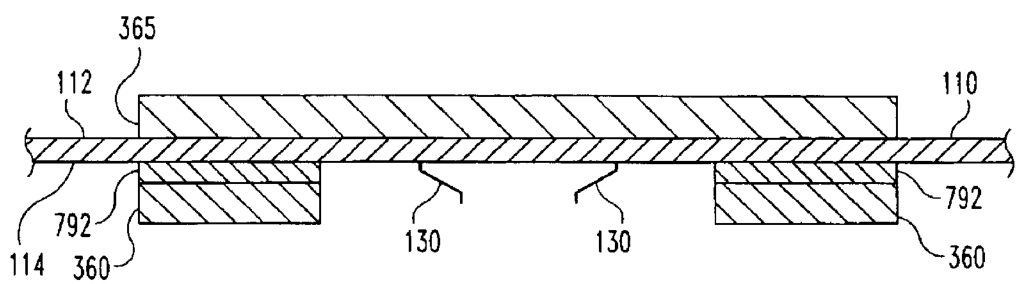
FIG. 7A is a cross-sectional view of the probe card of FIG. 7.

FIGS. 6 and 7 illustrate variations of another example according to the present invention. The dashed lines in the figures properly indicate the alignment of the various components although certain elements have been exaggerated for clarity. This particular example of the present invention incorporates a means for allowing radial movement of the probe card 110 relative to the wafer side stiffening element 360. This radial movement means is disposed between the probe card 110 and the wafer side stiffening element 360. Specifically shown are rolling members 690 (FIG. 6) and lubricating layer 792 (FIG. 7), although other means for allowing radial motion of the probe card 10 relative to the wafer side stiffener 360 are also contemplated. The rollers 690 may be ball bearings, cylindrical bearings, or any other suitable shape. The lubricating layer 792 may be a layer of graphite or other suitable material. Alternatively, the lubricating layer 792 may be a low-friction film composed of a material such as diamond or Teflon®, or any other suitable material. This lubricating layer may be applied to the surface of the probe card 10, the surface of the stiffening element 360, 365, or both.

Figure 6B:
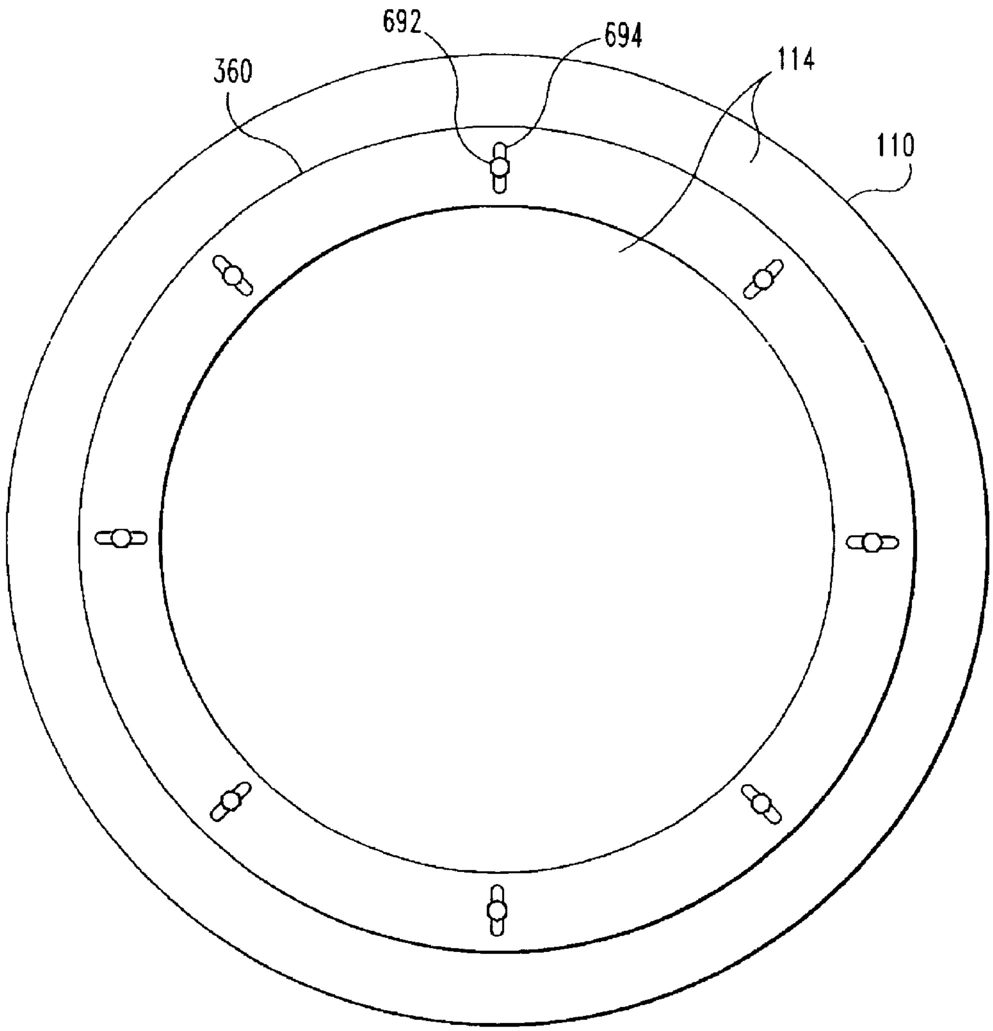
FIG. 6B is a bottom plan view of the probe card of FIG. 6.

Although a fastening means between the probe card 10 and the wafer side stiffening element 360 is omitted from the illustration, it is understood that any suitable fastening method may be used. The wafer side stiffening element 360 may be fastened to the tester side stiffening element 365 or alternatively directly to the probe card 10 as described hereinabove. Although known fastening methods such as bolts or screws will typically allow for sufficient radial movement between the probe card 10 and the wafer side stiffening element 360, the present invention also contemplates the use of a fastening means allowing for greater radial movement such as radially oriented slots, dovetails or tracks. As shown in FIG. 6B, the wafer side stiffening element 360 may be fastened to the probe card 10 by bolts 692 which pass through slots 694 in the wafer side stiffening element 360. These bolts 692 may be fastened directly to the probe card 110 or may alternatively pass through holes (not shown) in the probe card 10 and fasten to the tester side stiffening element (not shown).

The example of the present invention illustrated in FIGS. 6 and 7 compensates for thermally induced motion of a probe card in the following manner. In the case of a probe card 10 exposed to a wafer 140 at a higher temperature than the ambient temperature of the tester, a temperature gradient begins to develop across the probe card 110. The wafer side of the probe card 114 begins to expand more rapidly than the tester side 112 of the probe card. As the wafer side of the probe card 114 begins to expand, the rollers 690 allow for radial motion of the probe card 110 relative to the wafer side stiffening element 360. Typically only a small amount of radial motion is necessary to prevent deformation of the probe card. In some cases, movement of 10 to 20 microns is sufficient, although the present invention also contemplates embodiments allowing for greater and lesser degrees of radial motion.

Figure 8:
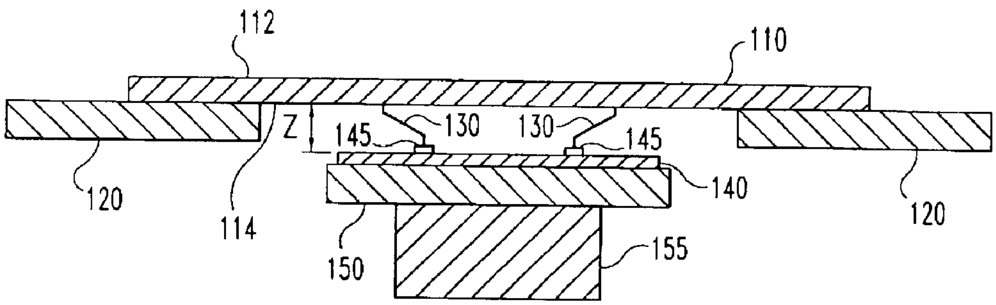
FIG. 8 is a cross-sectional view of a probe card according to yet another example of the present invention.

Yet another example of the present invention may be described by referring to FIG. 8. In this particular example of the present invention, the distance between the wafer 140 and the probe card 110 is corrected during the testing procedure to compensate for thermally induced motion of the probe card. As previously described, once the wafer 140 is secured in the tester to the wafer chuck 150 it is moved to the effective distance Z from the probe card 110 to allow for engagement of the probes 130 with the bond pads 145. As testing proceeds, a thermal gradient in the probe card 110 may be induced by proximity to a wafer 140 at a temperature significantly different from that of the tester leading to thermally induced motion of the probe card 110 as shown in FIGS. 2A and 2B. To compensate for this motion, the present invention also contemplates a system whereby the distance Z between the probe card 110 and the wafer 140 is monitored during the testing procedure. As thermally induced motion begins the actual distance between the probe card 110 and the wafer 140 may change, this alteration is detected and the wafer 140 is returned to the optimally effective distance Z. For example, if the probe card began to sag as shown in FIG. 2A, the decrease in the actual distance Z' between the probe card 110 and the wafer 140 is detected and the table actuator 155 lowered to return the wafer 140 to the optimal effective distance Z from the probe card.

The actual distance between the probe card 110 and the wafer 140 may be monitored by any suitable means. Once such means includes monitoring the pressure exerted on the probe elements 130 by the bond pads 145. Changes in this pressure can be monitored and a signal relayed to the control system for the table actuator to order a corresponding corrective movement of the wafer 140. This is but one specific example of a means for monitoring the distance between the wafer 140 and the probe card 110. Other means for monitoring this distance such as the use of lasers, including proximity sensors, captive proximity sensors, or cameras are also contemplated by the present invention. Such sensors may be a part of the tester or alternatively may be incorporated in the probe card.

FIGS. 26–30 show diagrammatic views of an alternative method of monitoring the actual distance between the probe card 110 and the wafer 140 during the testing process. In the example illustrated in FIG. 26, a mirror 210 is attached to the probe card 110 or alternatively to a space transformer 230 (if used). A light beam 235 from a light source 200 is directed towards the mirror 210. The mirror 210 is positioned such that the light beam 235 is reflected towards a light detector 215 which detects the position of the light beam 235 and transmits this information to a positioning computer 225. Optionally, the signal from the light detector 215 may first pass through an amplifier 220 before transmission to the positioning computer 225. At initiation of the testing process when the probe card 110 is planar, the position of the light beam 235 is detected and noted as the zero position. As the testing process proceeds, thermal gradients may develop across the probe card 110 causing thermally induced motion of the probe card 110 as previously described. As the position of the probe card 110 changes from this thermally induced motion, the angle at which the light beam 235 strikes the mirror 210 also changes. This causes the reflected light beam 235 to strike the light detector 215 at a different position than the initial zero position. When this information is transmitted to the positioning computer 225, the change in the light beam 235 position causes the positioning computer 225 to generate a control signal that is transmitted to the tester. The tester then adjusts the Z position (vertical as shown) of the wafer 140 being tested to compensate for the thermally induced deflection of the probe card 110. Additional thermally induced motion of the probe card 110 is monitored by the positioning computer 225 continually during the testing procedure.

Figure 26:
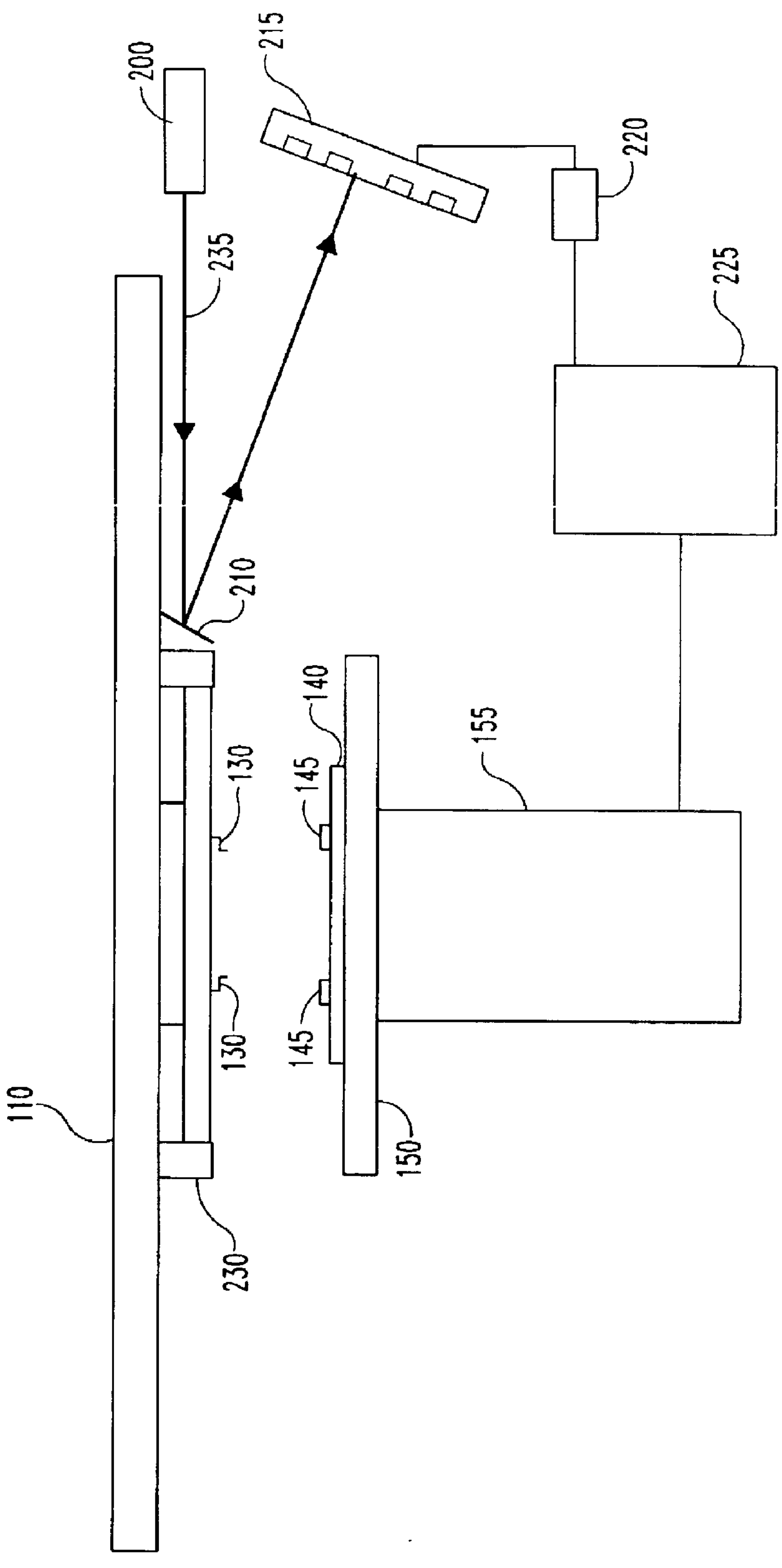
FIG. 26 is a front diagrammatic view of a tester using an optical motion detection system according to one embodiment of the present invention.

FIG. 26 shows but one example of a method of monitoring the actual distance between a probe card 110 and a wafer 140. The specific nature of the light source 200 used may vary. One such suitable light source 200 is a diode laser, although other light sources may also be used. The detector used 215 in a particular application will vary according to the light source 200 used. For example, if the light source 200 used is a laser, one suitable detector 215 would be a diode array detector such as the AXUV-20EL manufactured by International Radio Detectors. In this particular example the positioning computer 225, amplifier 220, light detector 215 and light source 200 are shown as individual components separate from the tester. Alternatively, these elements may be combined with one another (e.g., a positioning computer 225 incorporating an amplifier 220) or incorporated into the tester itself.

Figure 27:
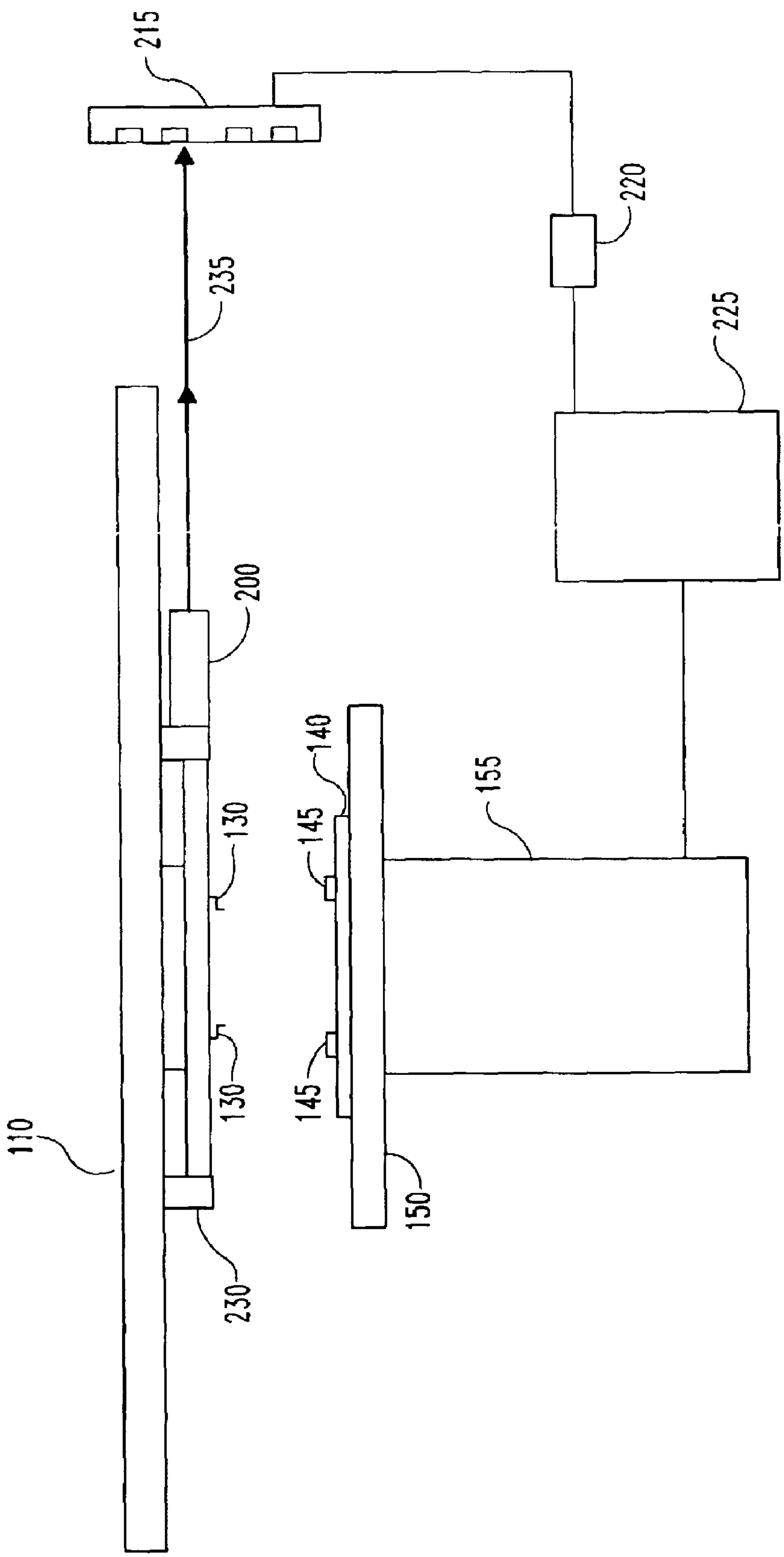
FIG. 27 is a front diagrammatic view of a tester using an optical motion detection system according to another embodiment of the present invention.

In another example of a method to detect thermally induced motion in a probe card 110 shown in FIG. 27, the light source 200 is attached to the space transformer 230 of the probe card 110. Alternatively, the light source 200 may be attached to the probe card 110. The light source 200 generates a light beam 235 that strikes the light detector 215. As in the example describe in FIG. 26, when the testing process begins the probe card 110 is initially planar and the position at which the light beam 235 strikes the detector 215 is noted as the zero position by the positioning computer 225. As the testing process begins and thermally induced motion of the probe card 110 develops, the location at which the light beam 235 strikes the detector 215 changes. In response to this change the positioning computer 225 generates a control signal causing the tester to adjust the Z position (vertical as shown) of the wafer 140 to compensate for the change in the probe card's 110 position.

Figure 28:
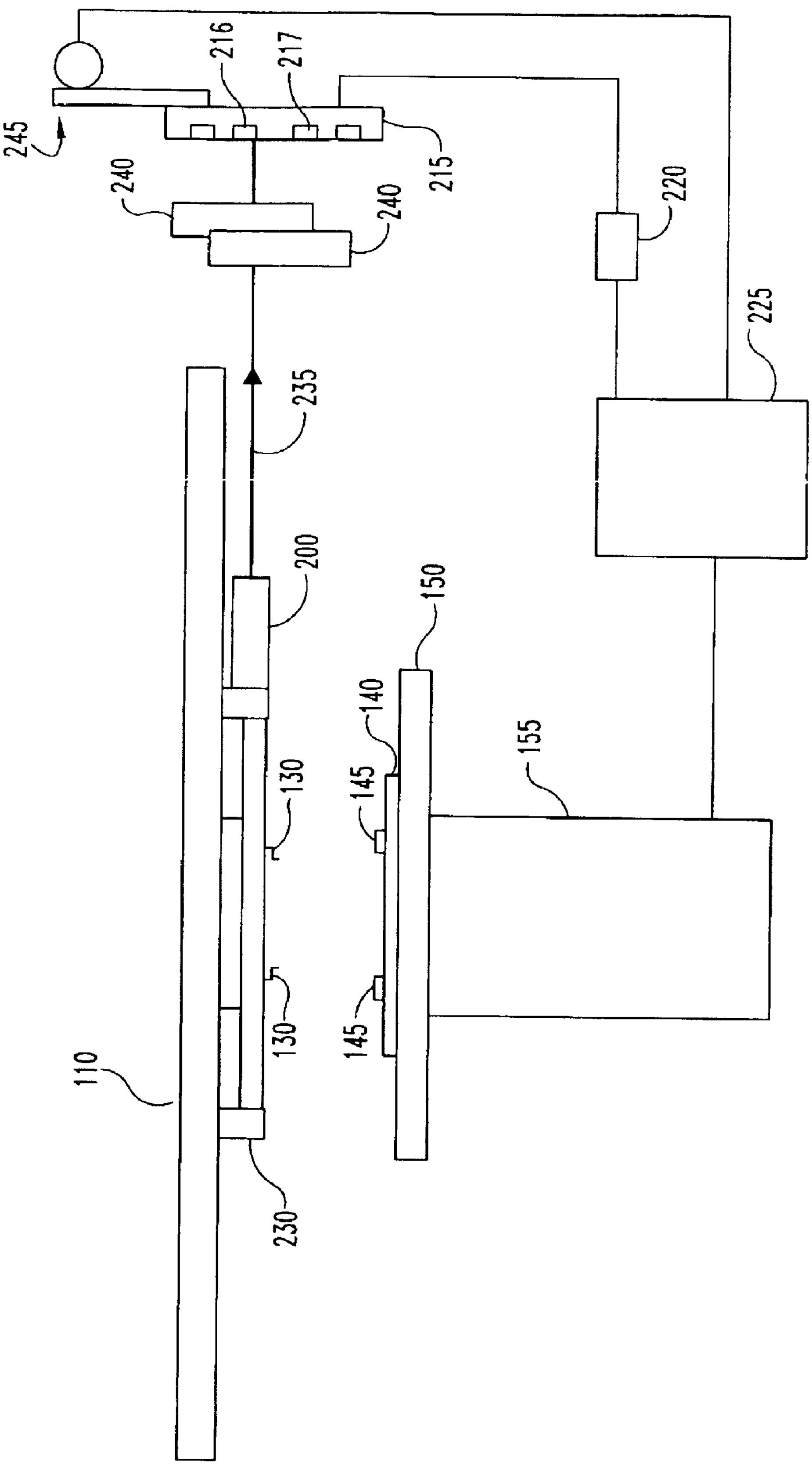
FIG. 28 is a front diagrammatic view of a tester using an optical motion detection system according to another embodiment of the present invention.

FIG. 28 shows another example of a method of monitoring the distance between a probe card 110 and the wafer 140 being tested. This example is similar to that described in FIG. 27 but incorporates two concave mirrors 240 located between the light source 200 and the detector 215. Additionally, this example includes a calibration device 245 to adjust the position of the detector 215. The calibration device 245 allows the position of the detector 215 to be adjusted so that the light beam 235 strikes the detector 215 at a predetermined location at the beginning of the testing procedure. This allows the system to compensate for variations in the initial position of a particular probe card within a tester and for variations in the attachment location of the light source to a particular probe card. The calibration device 245 may also be used to adjust the position of the detector 215 during the testing process to compensate for thermally induced motion of the probe card 110 which occurs during testing. The calibration device 245 shown in FIG. 28 may also be adapted to use in other examples of the monitoring method such as that shown in FIG. 26.

The calibration device 245 may also be used to compensate for other variations. For example, the light detector 215 may consist of a series of diodes whose output response to a particular light source is not necessarily equivalent. That is, the signal from the light beam 235 striking a particular detector element 216 is not necessarily precisely the same as that striking an adjacent detector element 217. By moving the light detector 215 in the Z axis direction (vertical as shown), each individual element of the light detector 215 may be subjected to the same light beam intensity. At the same time, the Z position of the detector 215 may be precisely measured by using an encoder on the Z motion drive for the detector 215, or some other means of measuring the position of the detector 215 in response to the Z drive. This allows the response of the light detector 215 to actual Z axis motion of the probe card 110 to be precisely known. Additionally, the output of the light source 200 may drift over time. To allow the system to differentiate between output drift and position changes of the probe card 110, periodically the system may stop compensating for Z axis motion of the probe card 110 and reenter calibration mode to reacquire the detector response to the light source 200. Optionally, it may be advantageous to insert a low pass filter between the amplifier 220 and the positioning computer 225 to prevent high frequency noise from entering the system.

Figure 28A:
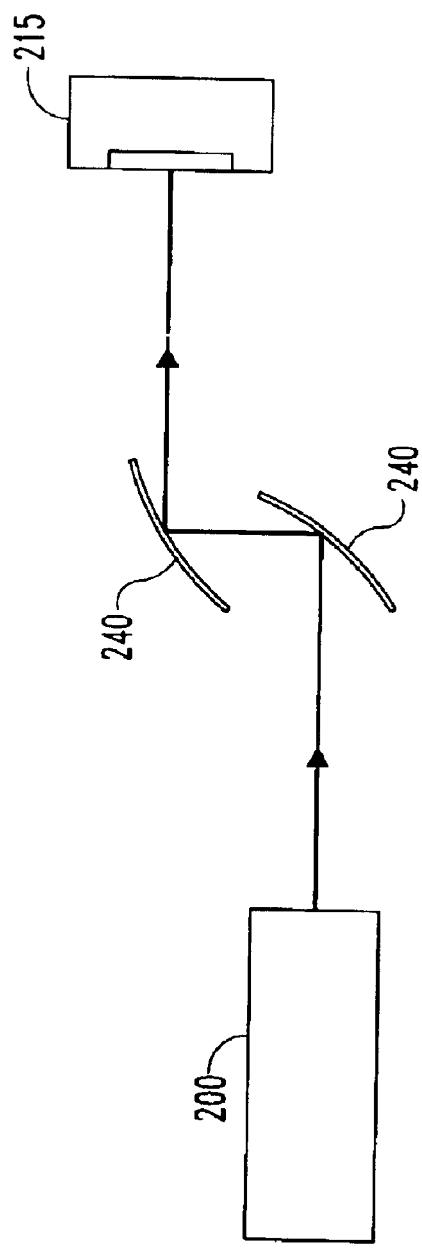
FIG. 28A is a top plan view of the optical motion detection system of FIG. 28.

The use of cylindrical mirrors 240 between the light source 200 and the light detector 215 also allows the system to compensate for variations in the light source's 200 position. As seen in a top view in FIG. 28A, the light beam 235 first strikes the cylindrical mirrors 240 prior to striking the light detector 215. The concave nature of the mirrors 240 compensates for variations in the initial position of the light source 200 by redirecting the light beam 235 towards the light detector 215. The calibration device 245 and the cylindrical mirrors 240 shown in FIG. 28 need not be used together and the present invention also contemplates monitoring methods which incorporate only one of these features.

Figure 29:
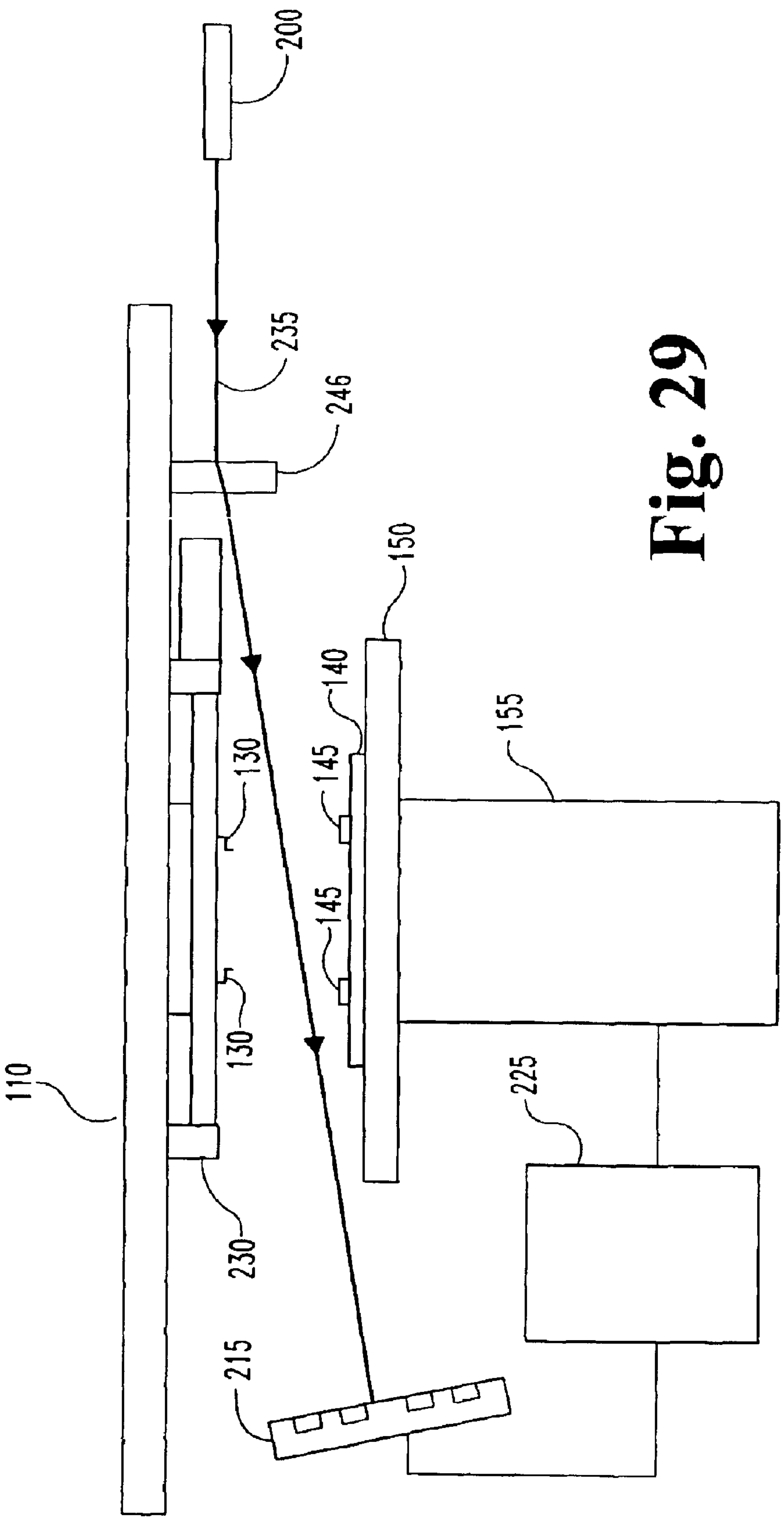
FIG. 29 is a front diagrammatic view of a tester using an optical motion detection system according to another embodiment of the present invention.

Another example of a method of monitoring the actual distance between a probe card 110 and the wafer 140 being tested is shown in FIG. 29. In this example, a lens 246 is located between the light source 200 and the light detector 215. The lens 246 is shown as attached the probe card 110, but alternatively the lens 246 may also be attached to a space transformer 230 (if used). In this particular example, the light source 200 produces a light beam 235 that passes through the lens 246. The lens 246 refracts the light beam 235, which then strikes the light detector 215. The position of the light beam 235 is detected and noted as the zero position at initiation of the testing process when the probe card 110 is planar. As the testing process proceeds thermal gradients cause thermally induced motion of the probe card 110. As the position of the probe card 110 changes from this thermally induced motion, the location at which the light beam 235 strikes the lens 246 also changes. This alters the angle to which the light beam 235 is bent by the lens 246 and causes the refracted light beam 235 to strike the light detector 215 at a different position than the initial zero position. When this information is transmitted to a positioning computer 225, the change in the light beam 235 position causes the positioning computer 225 to generate a control signal, which is transmitted to the tester. The tester then adjusts the Z position (vertical as shown) of the wafer 140 being tested to compensate for the thermally induced deflection of the probe card 110.

Figure 30:
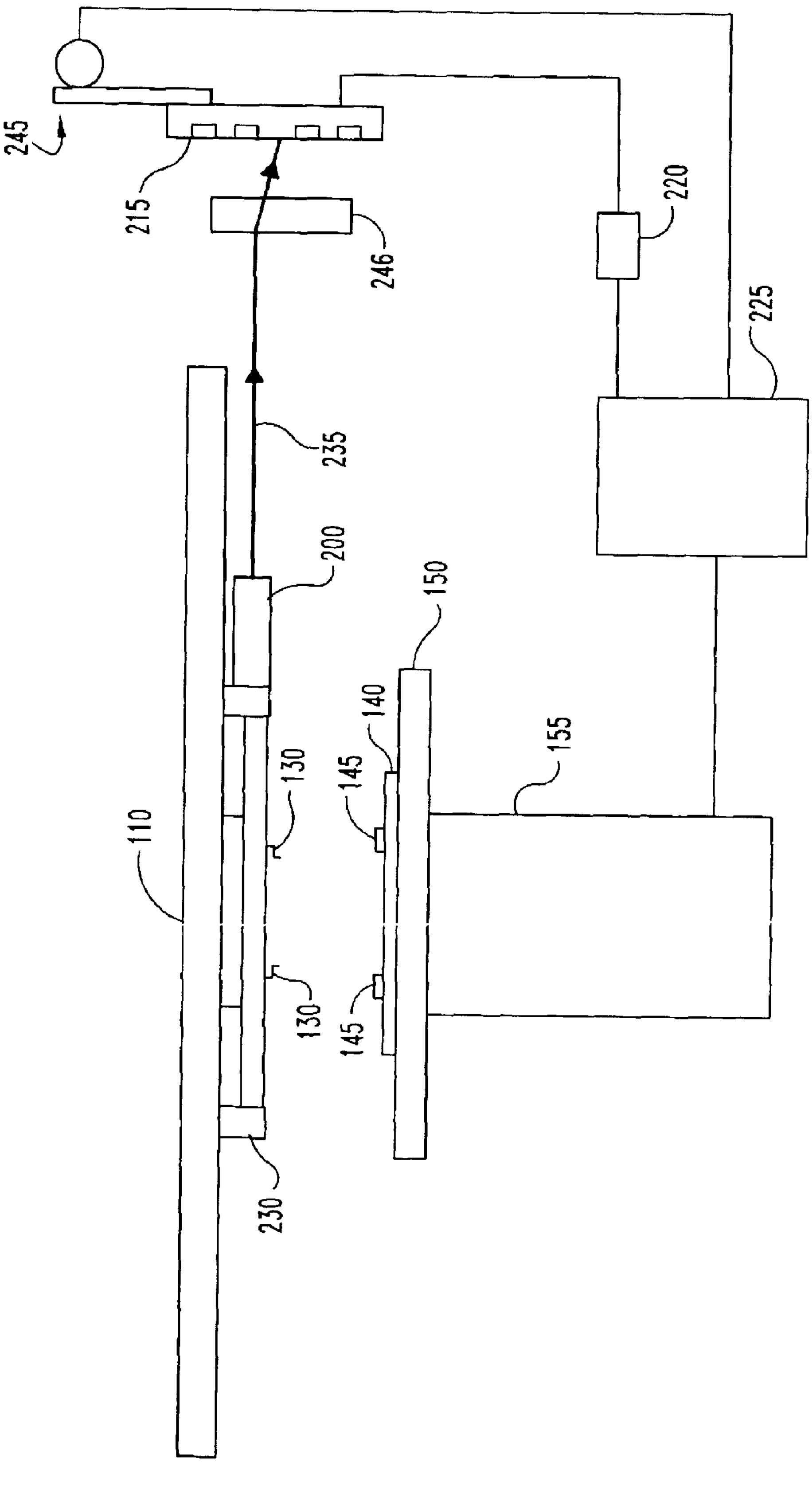
FIG. 30 is a front diagrammatic view of a tester using an optical motion detection system according to another embodiment of the present invention.

Another example of a distance monitoring method utilizing a lens 246 is shown in FIG. 30. In this example, the light source 200 is located on a space transformer 230 attached to the probe card 110. Alternatively, the light source 200 may be attached to the probe card 110 itself. The light source 200 generates a light beam 235, which is refracted by a lens 246 before striking a light detector 215. This particular example also shows the calibration device 245 previously described.

Figure 10:
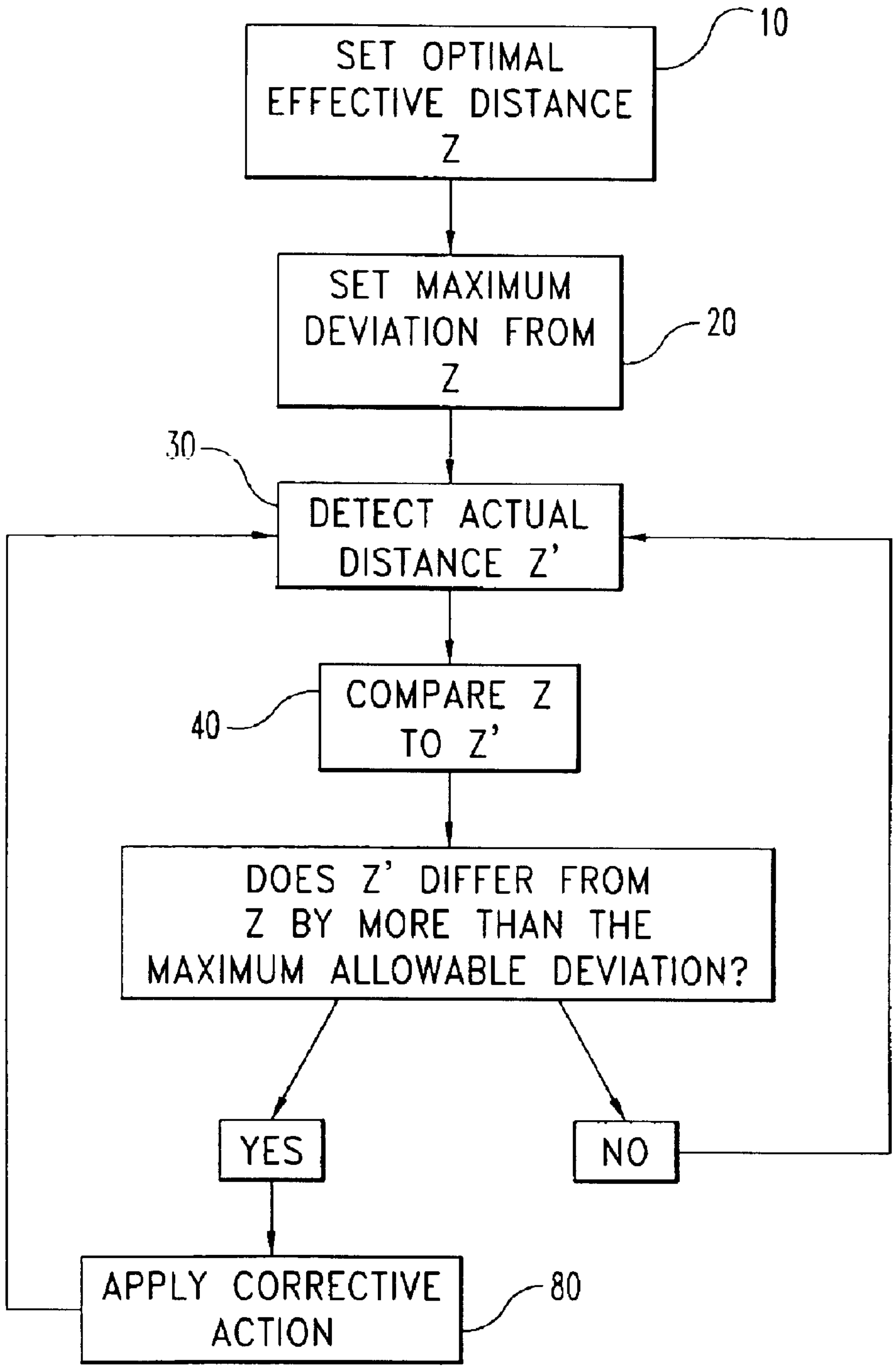
FIG. 10 is a flowchart depicting one example of a control program according to the present invention.

Preferably the actual distance Z' between the wafer 140 and the probe card 110 is monitored by a computer using a logic loop similar to that shown in FIG. 10. After the user inputs the desired distance Z between the wafer 140 and the probe card 110 to be maintained 10, indicates the maximum allowable deviation from this distance 20, and any other information specific to the particular testing procedure, the testing procedure begins. The computer begins by detecting the actual distance Z' between the wafer 140 and the probe card 110 at the step labeled 30 using a suitable detecting means as previously described. The computer then compares the actual distance Z' to the desired distance Z at the step labeled 40. If the absolute magnitude of the difference between Z and Z' is greater than the maximum allowable deviation as set at box 20, then the computer applies the appropriate corrective action 80 before returning to box 30 to begin the loop again. If the absolute magnitude of the difference between Z and Z' is less than the maximum allowable deviation as set at box 20, then the computer returns to the beginning of the logic loop 30. The corrective action taken at box 80 will of course depend on which particular corrective device or combination of devices as previously described are used with a particular probe card. Preferably where more than one device according to the present invention is used in a single probe card, a single computer will control all such devices, although this is not necessary. Preferably the control computer is a part of the tester although alternatively it may be incorporated on the probe card.

Control of the actual distance between the probe card 110 and the wafer 140 as previously described also compensates for probe card deformation other than thermally induced deformation. As the probe elements 130 are generally located near the center of the probe card 110 as seen in FIG. 1, the engagement of the probe elements 130 with the bond pads 145 imparts an upward (as shown) force on the center of the probe card 110. This force may lead to a deformation of the probe card 110 characterized by a bow near the center of the card. The control systems previously described may also correct for this type of probe card deformation by monitoring and correcting the actual distance between the probe card 110 and the wafer 140. These methods may also be used to compensate for deflection caused by force exerted on a probe card when a probe card contacts travel stops (not shown) designed to prevent damage to a wafer by a tester accidentally moving the wafer too close to the probe card.

An alternative method of maintaining the planarity of a probe card according to the present invention is shown in FIGS. 13–25. In this method planarity is maintained using at least one layer of a shape memory alloy (SMA) located on or in the probe card. A shape memory alloy is a member of a group of alloys that demonstrate the ability to return to a previously defined shape or size when subjected to the appropriate thermal conditions. Generally these alloys may be deformed at some lower temperature, and upon exposure to some higher temperature, return to their shape prior to deformation. SMAs undergo a phase transformation in their crystal structure when cooled from the stronger, higher temperature form (austenite) to the weaker, lower temperature form (martensite). When an SMA is in its martensitic phase it is easily deformed. When the deformed SMA is heated through its transformation temperature, it reverts to austenite and recovers its previous shape. Preferably the SMA used will be one of several suitable Nickel-Titanium alloys (NiTi). NiTi alloys exhibit excellent strength, thermal stability and corrosion resistance. Other SMAs such as copper-based alloys may also be used to practice the present invention.

Figure 13A:
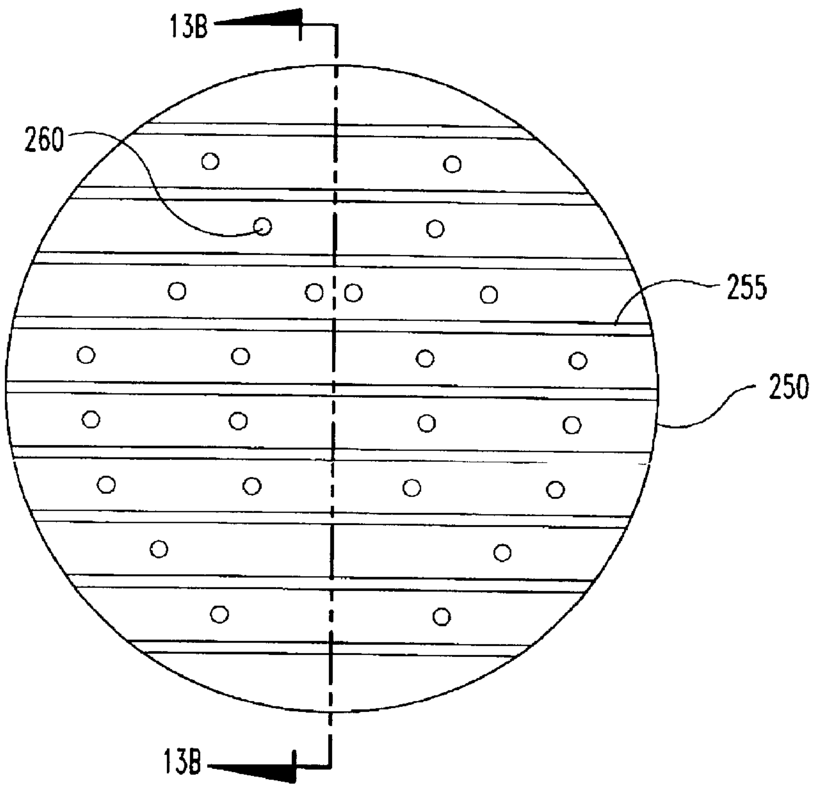
FIG. 13A is a top plan view of another example of a probe card according to the present invention.
Figure 13B:
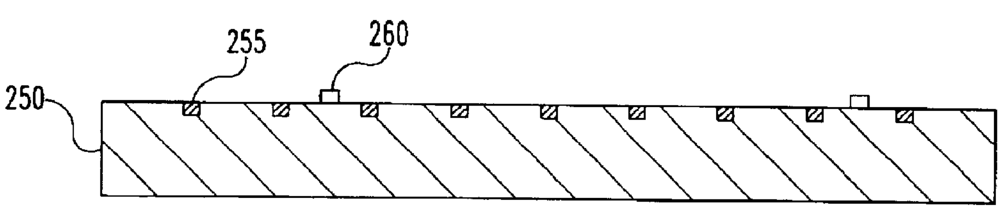
FIG. 13B is a cross-sectional view of the probe card of FIG. 13A.

As seen in the example shown in FIGS. 13A-B, a plurality of strips 255 of an SMA are incorporated into the surface of a probe card 250. The planarity of the probe card 250 in this particular example is monitored by using a plurality of strain gauges 260 located on the surface of the probe card 250 as seen in cross-sectional view 13B. These strain gauges 260 are in electrical contact with a computer (not shown) which monitors the position of the probe card 250. When the strain gauges 260 detect a predetermined strain at the surface of the probe card 250 indicating deformation of the card, the monitoring computer issues a command to heat the SMA strips 255 located where the deflection is occurring. When the SMA strips 255 are heated, they transform from the martensitic phase to the austenitic phase and return to their memory shape (i.e., planar). The return of the SMA strips 255 to a planar state exerts a force on the probe card 250 to also return to a planar state.

The example shown in FIGS. 13A–B is but one example of using SMA layers to control planarity. Although this example shows the use of SMAs to maintain planarity in a probe card, the present invention also contemplates the use of SMAs in any PCB or built up structure where maintaining planarity of the structure is important. Also, although this example shows the use of strain gauges to monitor the planarity of the probe card, other methods of monitoring planarity such as optical methods previously described may also be used.

Figure 14A:
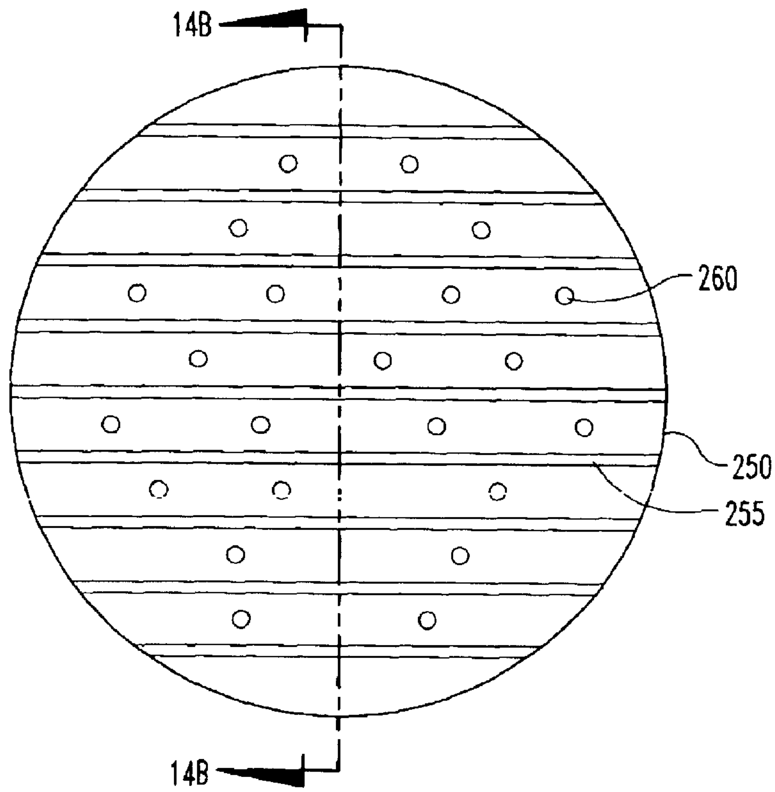
FIG. 14A is a top plan view of another example of a probe card according to the present invention.
Figure 14B:
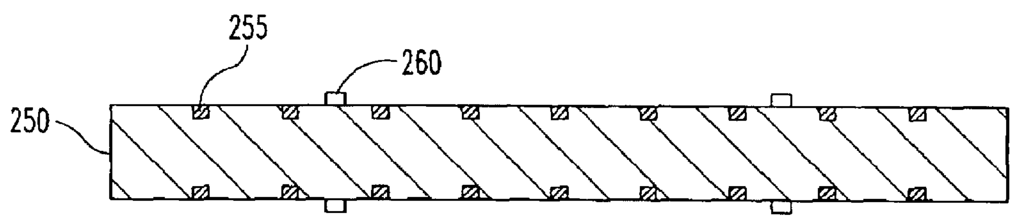
FIG. 14B is a cross-sectional view of the probe card of FIG. 14A.
Figure 15A:
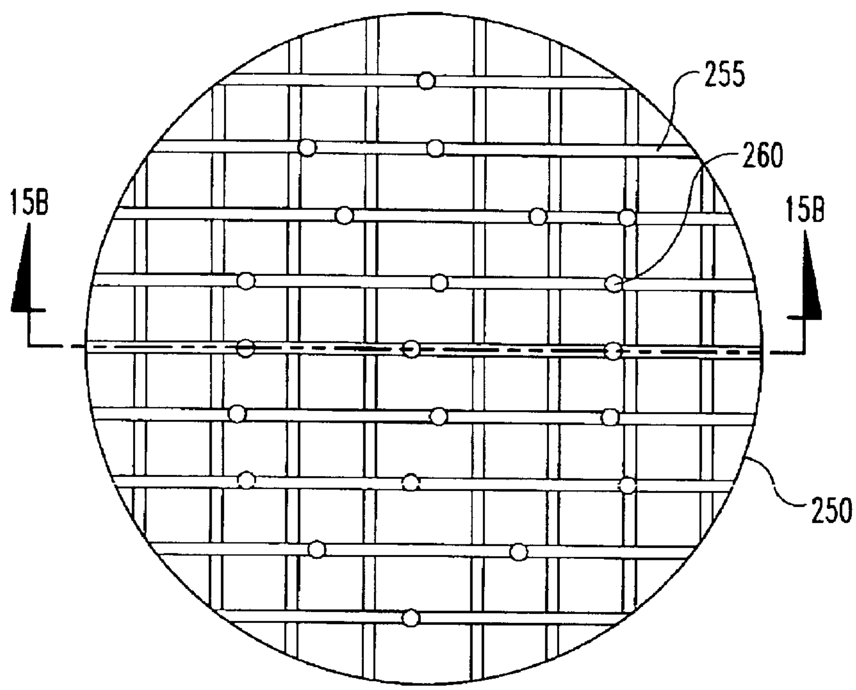
FIG. 15A is a top plan view of another example of a probe card according to the present invention.
Figure 15B:
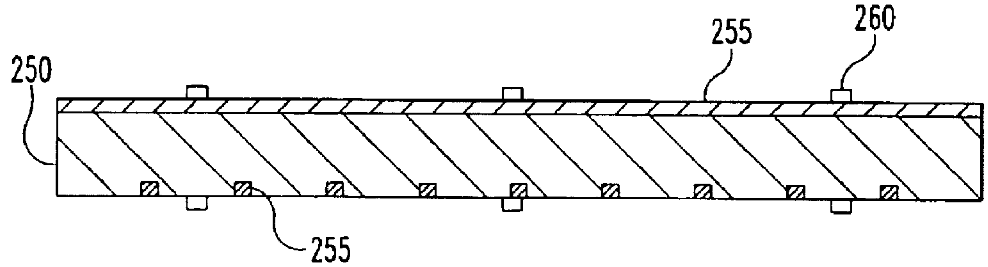
FIG. 15B is a cross-sectional view of the probe card of FIG. 15A.
Figure 16A:
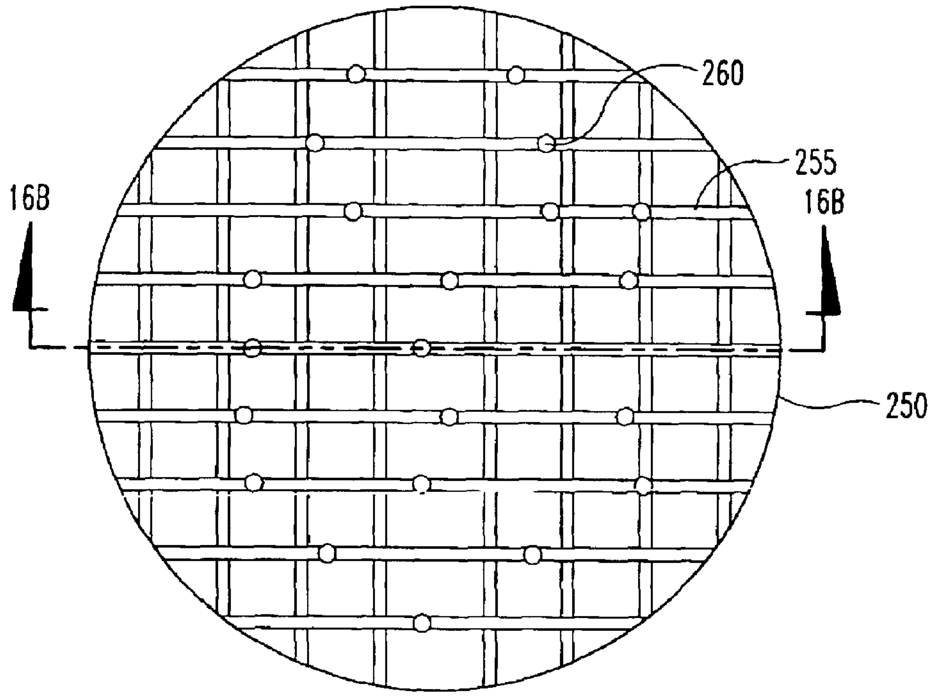
FIG. 16A is a top plan view of another example of a probe card according to the present invention.
Figure 16B:
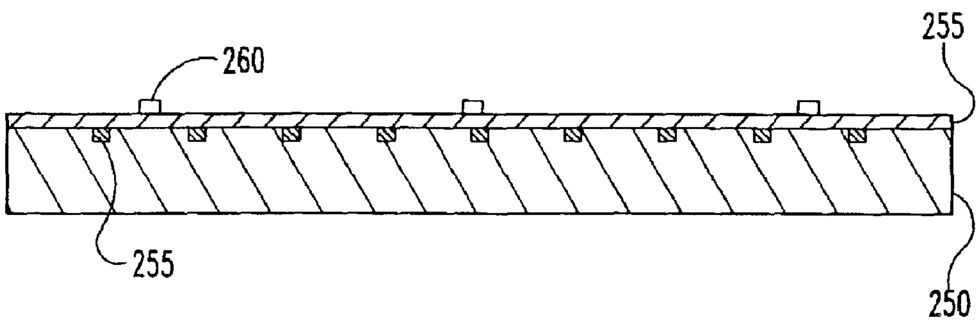
FIG. 16B is a cross-sectional view of the probe card of FIG. 16A.
Figure 17A:
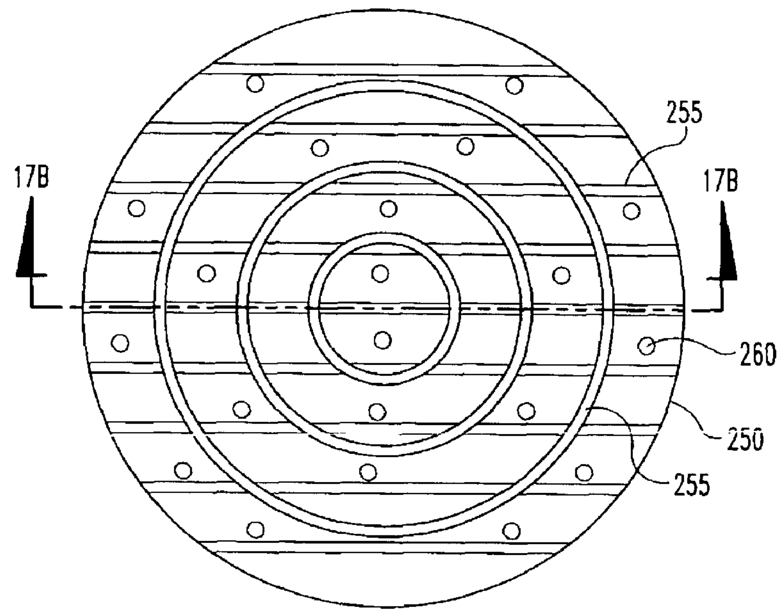
FIG. 17A is a top plan view of another example of a probe card according to the present invention.
Figure 17B:
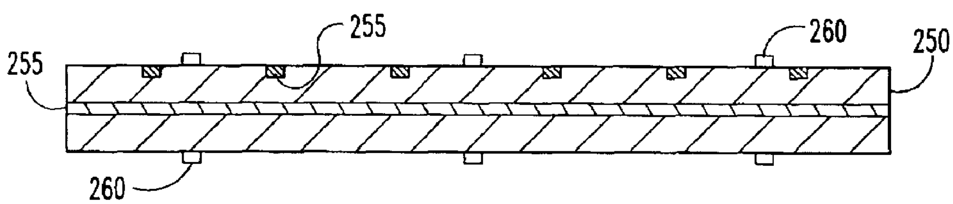
FIG. 17B is a cross-sectional view of the probe card of FIG. 17A.

The particular arrangement of SMA layers 255 and strain gauges 260 shown in FIGS. 13A–B is but one potential arrangement. Other, non-limiting suitable arrangements are shown in FIGS. 14–25. FIGS. 14A–B show a probe card 250 having SMA strips 255 imbedded in both the upper and lower surfaces (as shown in FIG. 14B) of the probe card 250. FIGS. 14A–B also show the use of strain gauges 260 located on both the upper and lower surfaces of the probe card 250 to monitor planarity. FIGS. 15A–B show an arrangement similar to than shown in FIGS. 14A–B. In this example, however, the SMA strips 255 near the upper surface (as shown in FIG. 15B) of the probe card 250 are arranged to be generally perpendicular to the SMA strips 255 near the lower surface of the probe card 250. Alternatively, both layers of SMA strips 255 could be arranged near the same surface of the probe card 250 as shown in FIGS. 16A–B. The SMA strips 255 need not be linear. In the example arrangement shown in FIGS. 17A–B, a probe card 250 has a plurality of SMA strips 255 embedded near the center of the structure (as shown in FIG. 17B) and a plurality of concentric circular SMA strips 255 embedded near the upper surface of the structure.

Figure 18A:
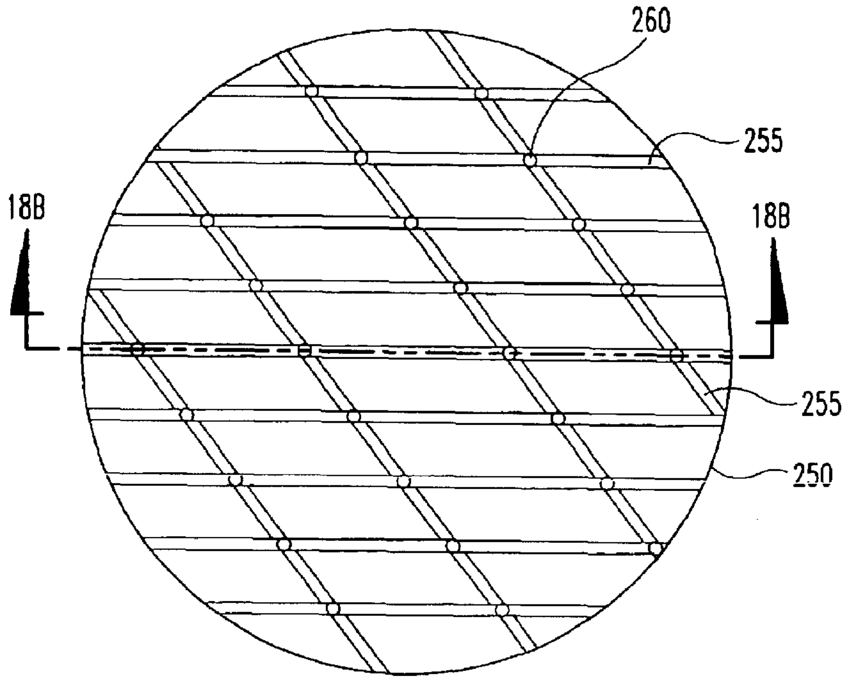
FIG. 18A is a top plan view of another example of a probe card according to the present invention.
Figure 18B:
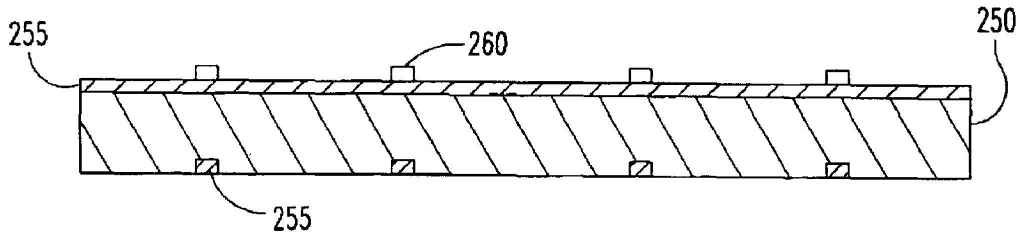
FIG. 18B is a cross-sectional view of the probe card of FIG. 18A.
Figure 19A:
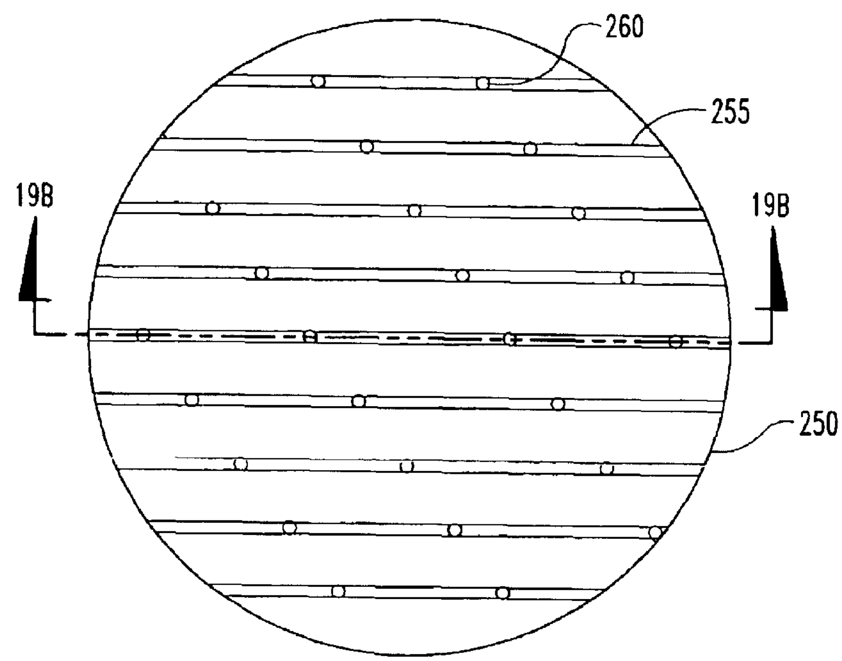
FIG. 19A is a top plan view of another example of a probe card according to the present invention.
Figure 19B:
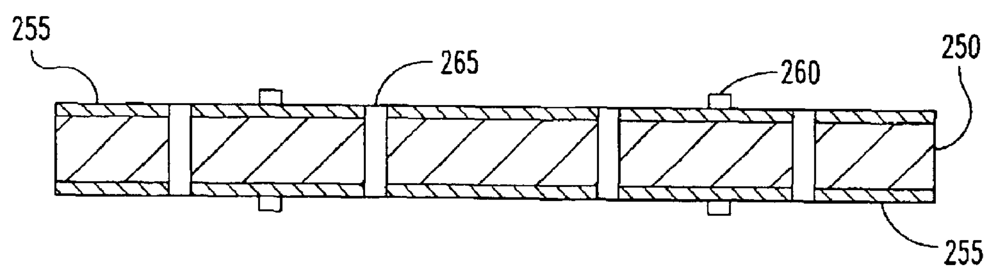
FIG. 19B is a cross-sectional view of the probe card of FIG. 19A.

The SMA strips need not be embedded in the probe card structure. As seen in FIGS. 18A-B, a probe card 250 may have a plurality of SMA strips 255 embedded in one side and a plurality of SMA strips 255 fixed to the opposite surface. This example also illustrates that the different layers of SMA strips 255 may be disposed at some angle other than parallel or perpendicular as shown in the previous configurations. FIGS. 19A–B show an example of the present invention of a probe card 250 having no embedded SMA strips. Instead, in this example SMA strips 255 are fixed to the upper and lower surfaces (as shown in FIG. 19B) of the probe card 250. This example also shows a plurality of fastener holes 265 passing through the SMA strips 255 and the probe card 250. These fastener holes 265 may be used to secure other devices to the probe card 250 such as a space transformer.

Figure 20A:
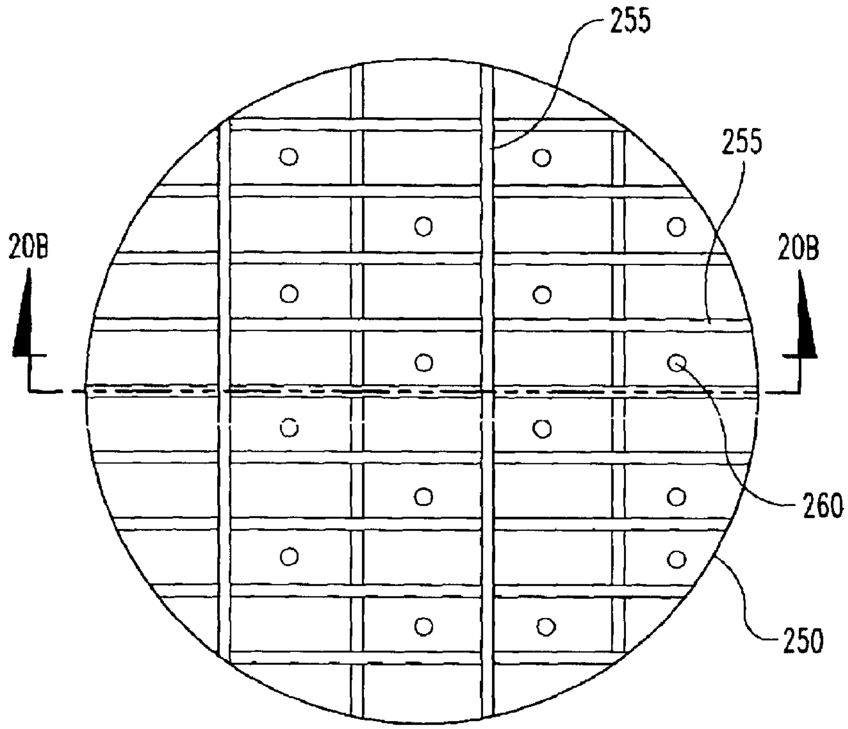
FIG. 20A is a top plan view of another example of a probe card according to the present invention.
Figure 20B:
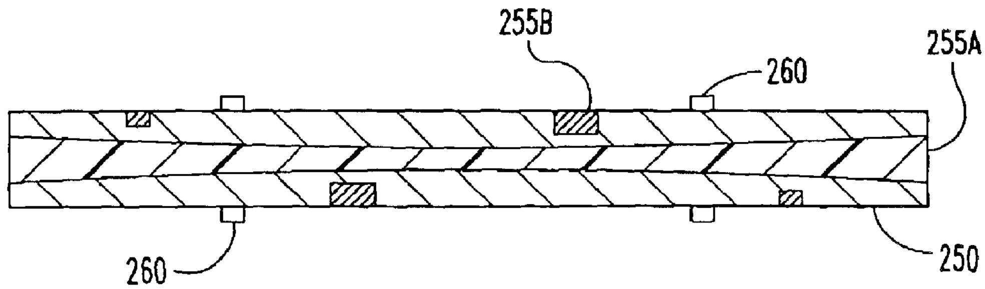
FIG. 20B is a cross-sectional view of the probe card of FIG. 20A.
Figure 21A:
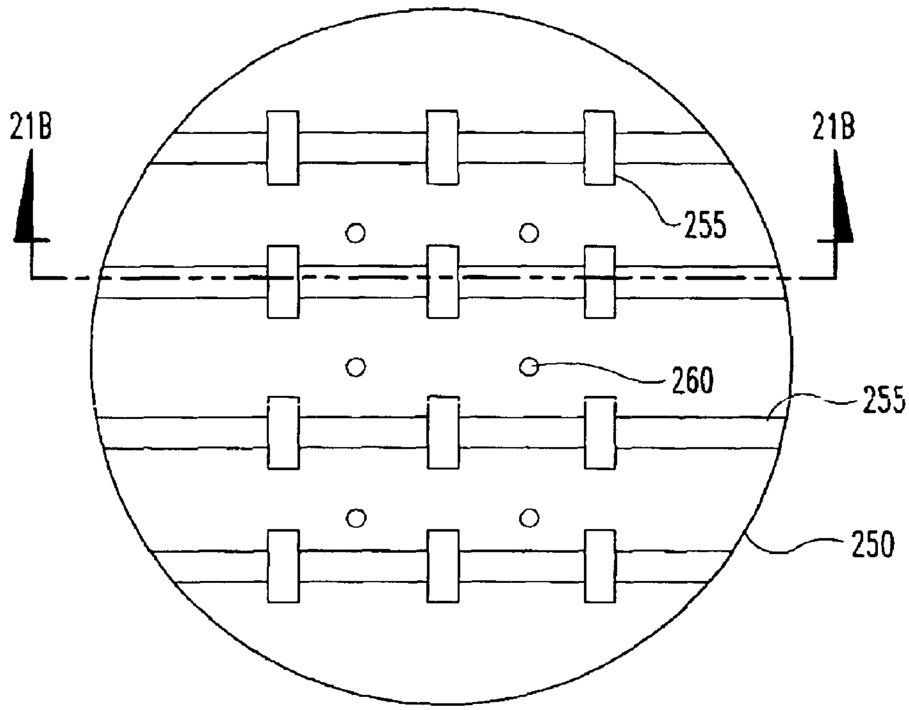
FIG. 21A is a top plan view of another example of a probe card according to the present invention.
Figure 21B:
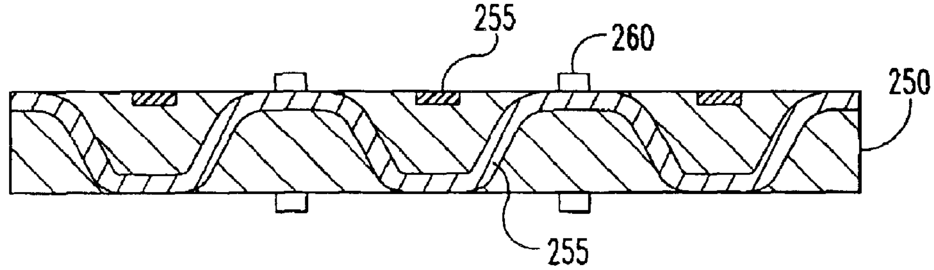
FIG. 21B is a cross-sectional view of the probe card of FIG. 21A.

The SMA strips may be of varying thickness as desired. FIGS. 20A–B show a probe card 250 having a plurality of SMA strips 255 embedded in the card 250. The strips in this particular example vary in thickness across their length. Some of the strips 255A are thicker near the end of their length while others 255B are thicker near the center of their length. As seen in FIGS. 21A–B, SMA strips 255 may be embedded in a probe card 250 so that alternating sections of a particular strip are near the upper and lower surfaces of the probe card 250.

Figure 22A:
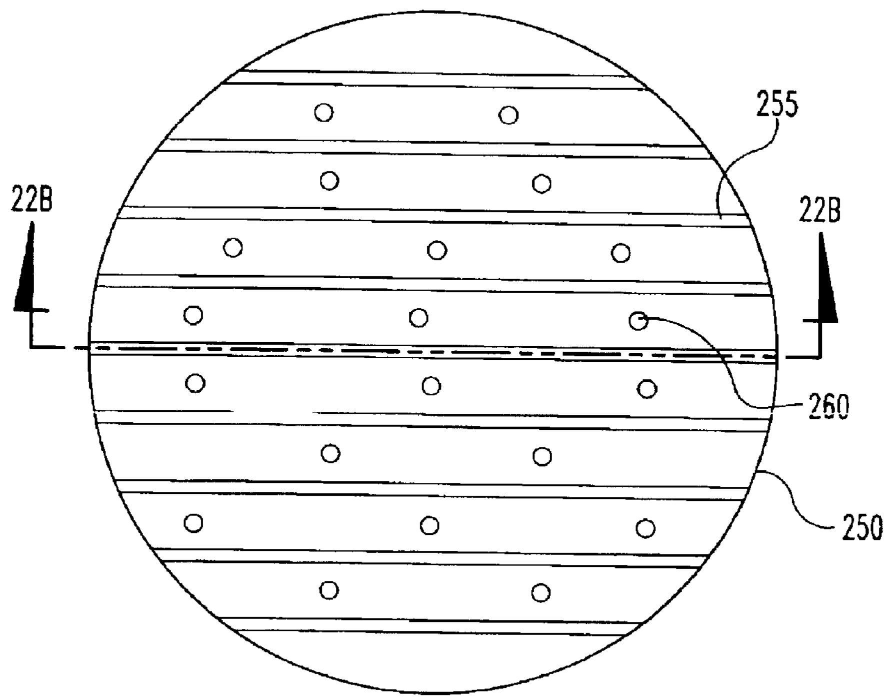
FIG. 22A is a top plan view of another example of a probe card according to the present invention.
Figure 22B:
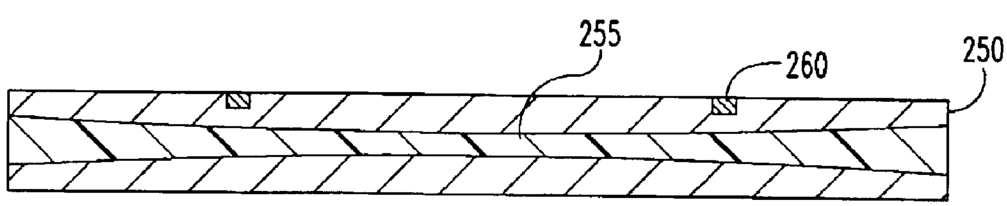
FIG. 22B is a cross-sectional view of the probe card of FIG. 22A.
Figure 23A:
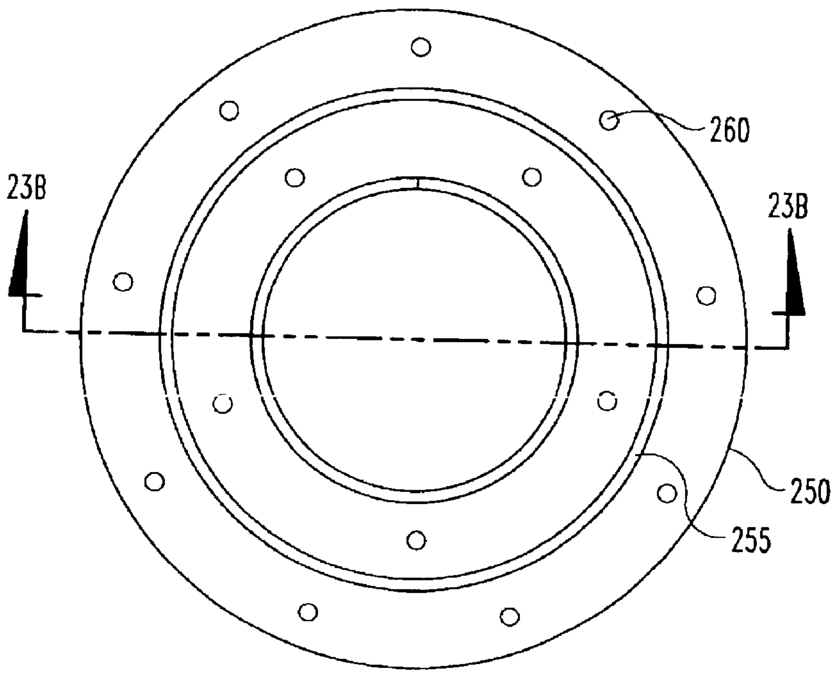
FIG. 23A is a top plan view of another example of a probe card according to the present invention.
Figure 23B:
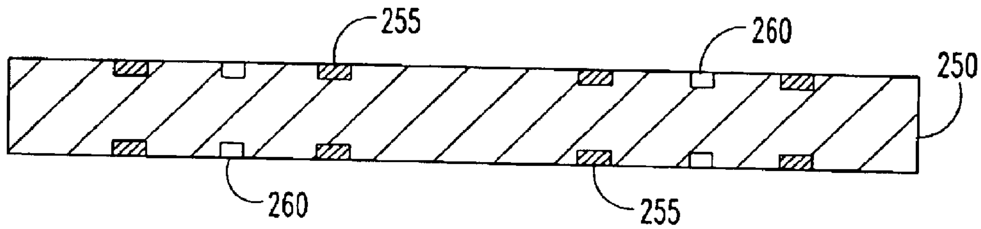
FIG. 23B is a cross-sectional view of the probe card of FIG. 23A.
Figure 24A:
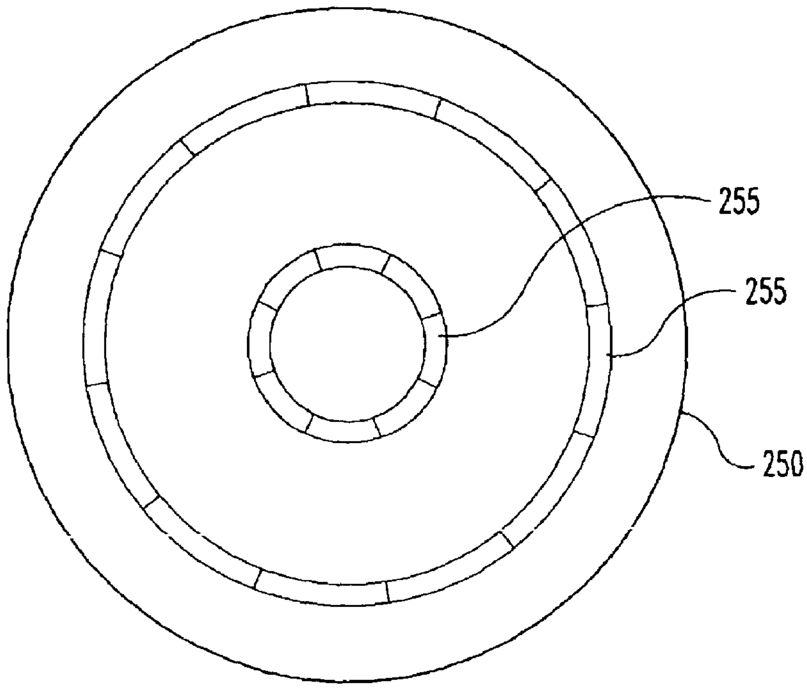
FIG. 24A is a top plan view of another example of a probe card according to the present invention.
Figure 24B:
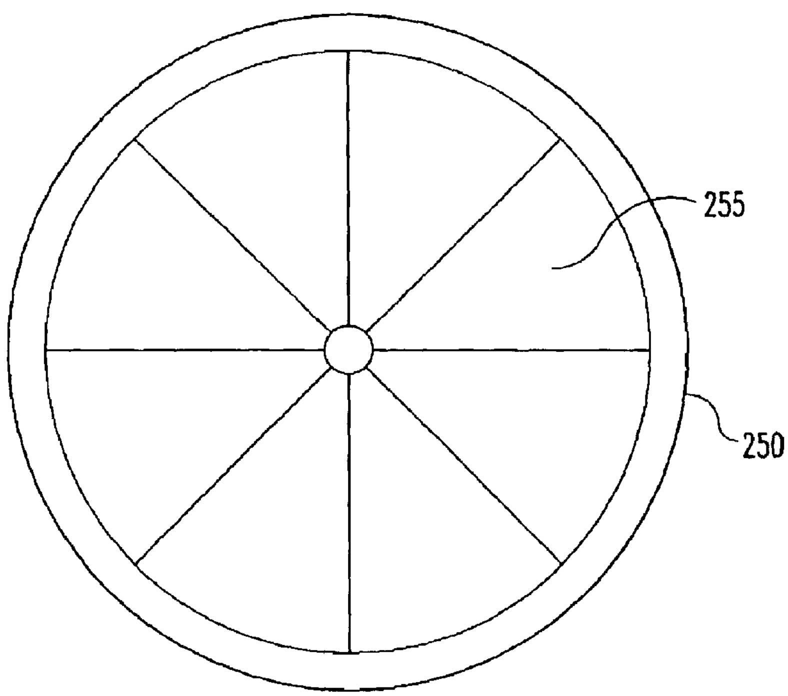
FIG. 24B is another top plan view of another example of a probe card according to the present invention.
Figure 24C:
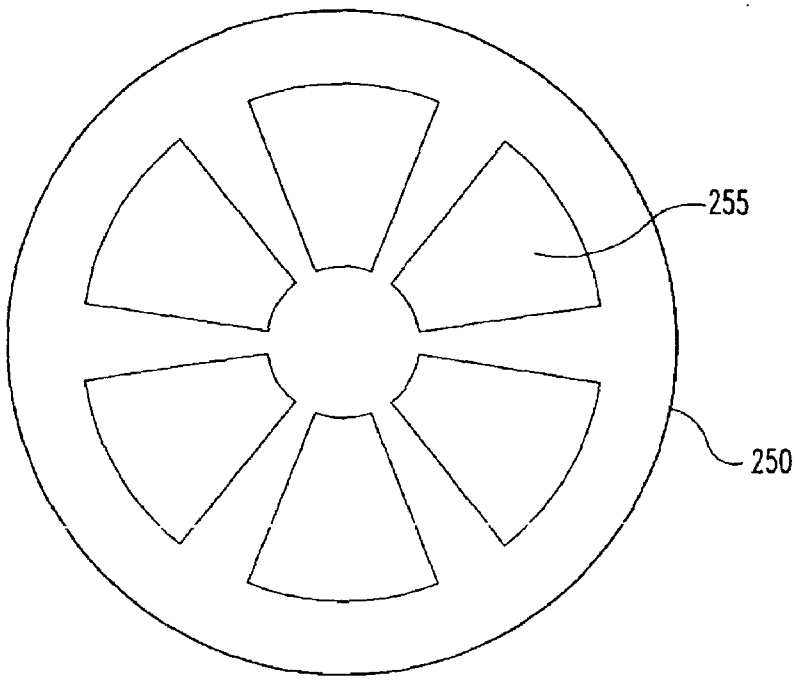
FIG. 24C is another top plan view of another example of a probe card according to the present invention.
Figure 25:
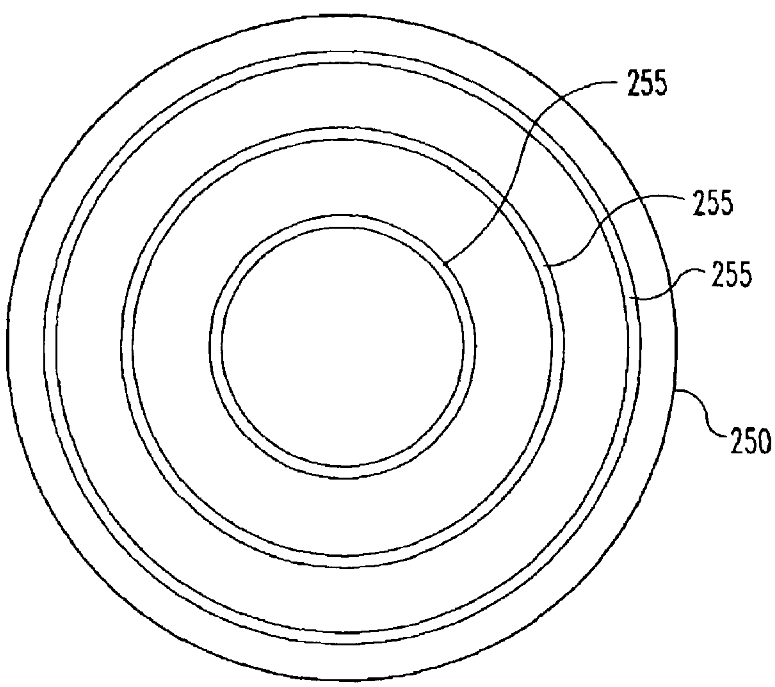
FIG. 25 is a top plan view of another example of a probe card according to the present invention.

The strain gauges used to monitor planarity of the probe card need not be attached to the surface of the card. As seen in FIGS. 22A–B, strain gauges 260 may also be embedded in the probe card 250. Embedded strain gauges may also be used with any of the configurations of SMA strips previously described. For example, embedded strain gauges 260 may be used with a circular configuration of SMA strips 255 as shown in FIGS. 23A–B. FIGS. 24A–25 show other examples of circular arrangements of SMA material 255 which may be used to practice the present invention.

Figure 11:
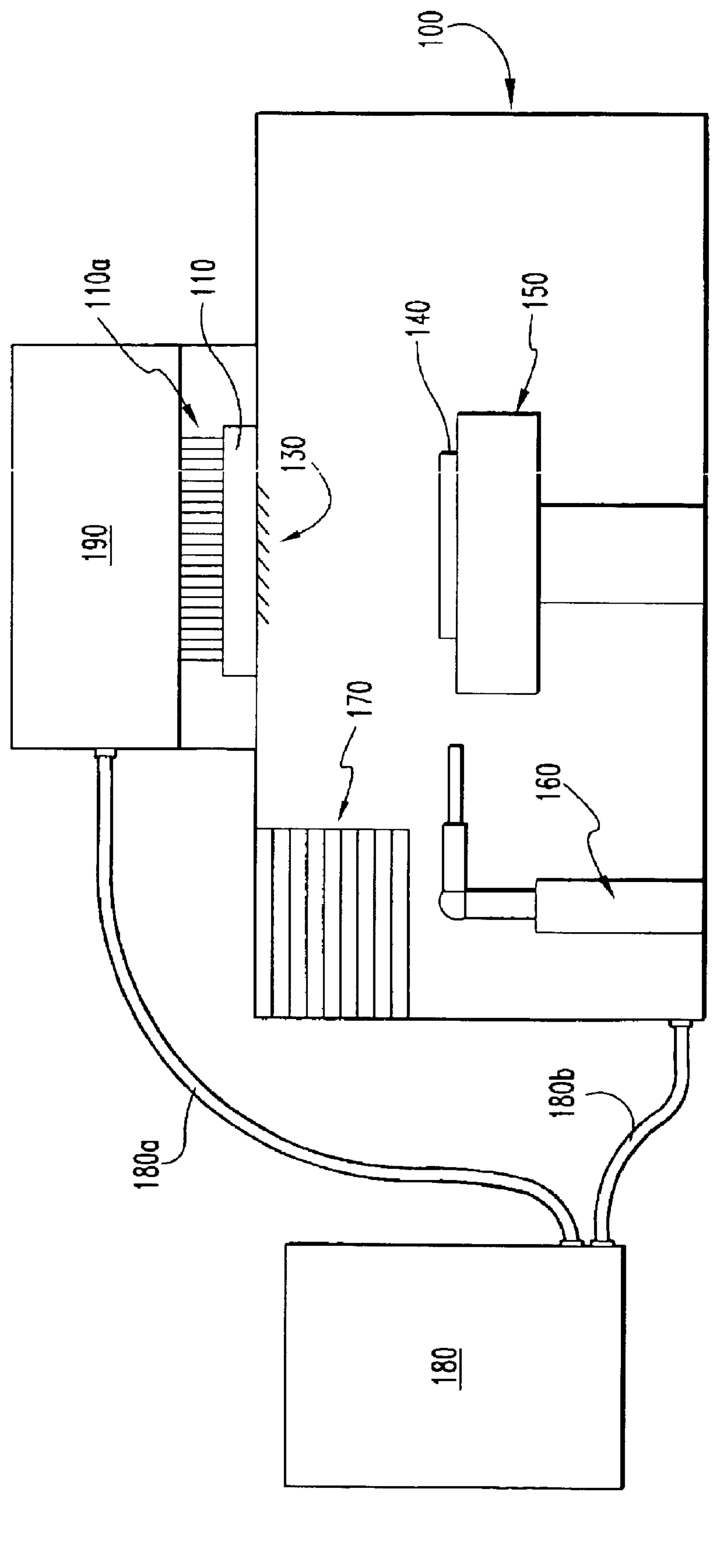
FIG. 11 is a front diagrammatic view of a prober and a tester connected by two communications cables according to one embodiment of the present invention.
Figure 12:
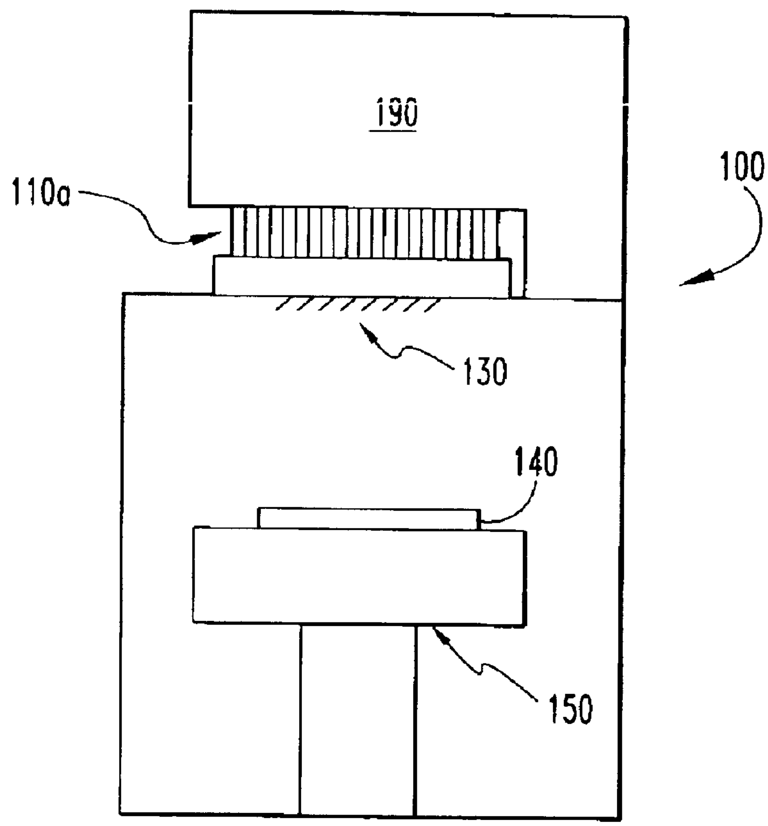
FIG. 12 is a side diagrammatic view of the prober of FIG. 11.

FIGS. 11 and 12 show diagrammatic views of one example of a prober and a tester usable in connection with the present invention. In this particular embodiment, prober 100 is physically separate from tester 180. They are connected by one or more cables, such as communication cable 180*a* and 180*b* as illustrated. Cable 180*a* connects to the test head of the prober that is connected to probe card 110 by electrical connections 110*a*. Probe card as probes 130 as previously described. In this embodiment, wafers, such as wafer 140 on stage 150, may be placed from the wafer boat 170 by robotic arm 160. Tester 180 generates test data that is sent to the tester 190 via communications cable 180*a* and may receive response data from the tester via communications cable 180*a*. The test head 190 receives data from the test head 180 and passes the test data through the probe card 110 to the wafer. Data from the wafer is received through the probe card and sent to the tester. The prober houses, in the preferred embodiment, the wafer boat stager robotic arm as illustrated. The tester may control the prober in a variety of ways, including communication cable 180*b*. The wafer boat 170 stores wafers to be tested or that have been tested. The stage supports the wafer being tested, typically moving it vertically and horizontally. Typically, the stage is also capable of being tilted and rotated and is capable of moving the wafer being tested against probes 130. This may compromise a wafer chuck and table actuator as previously described. The robotic arm 160 moves wafers between stage 150 and the wafer boat 170.

The tester is typically a computer, and the prober typically also includes a computer or at least a computer-like control circuitry (e.g. a microprocessor or microcontroller or microcode). Test head 190 may similarly include computer or computer-like control circuitry. In the preferred embodiment the computer which carries out the acts illustrated in FIG. 10 is preferably located in the prober. This may be an existing computer or computer-like control circuitry already in the prober or alternatively a new computer added to the prober for this purpose. Alternatively, the computer may be located in the tester 180, in which case feedback signals regarding the position of the wafer with respect to the probe card would be typically communicated to the tester via communication cable 180*b*. The control signals removing the stage are likewise communicated via that cable.

As yet another alternative, the computer may be located in the test head 190 the suitable communication means between the prober 100 and test head 190. Such communication means may be via wired connections, RF transmissions light or other energy beam transmissions and the like.

Yet another alternative, a separate computer distinct from the tester, test head and prober, could be used and connected electrically to the prober for this purpose.

As yet another alternative, a computer, microprocessor, microcontroller and the like may actually be made part of the probe card 110 for the appropriate input and output connections to facilitate the running of steps of FIG. 10. For example, in this way each probe card may have as a part of or imbedded therein its own dedicated and/or customized algorithm acts and/or parameters such as those provided for in connection with FIG. 10.

Figure 9:
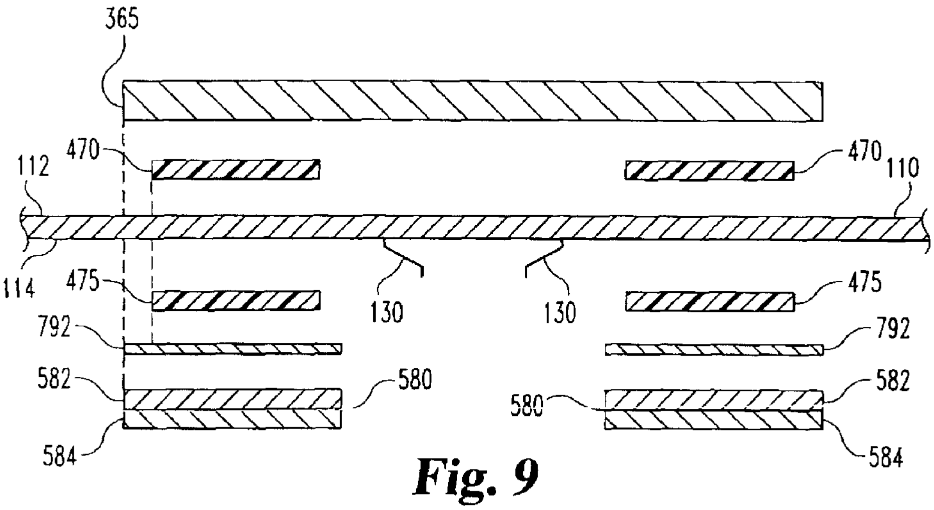
FIG. 9 is an exploded, cross-sectional view of a probe card according to another example of the present invention.
Figure 9A:
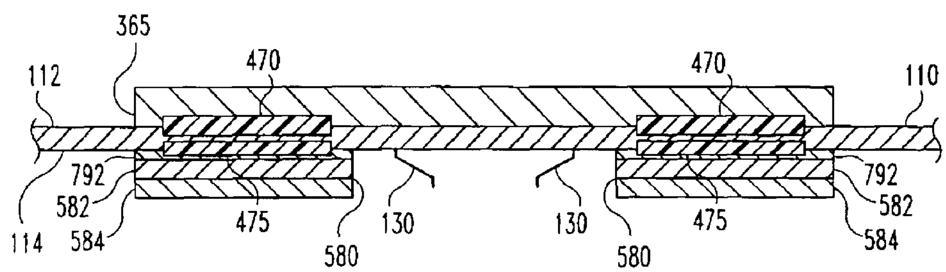
FIG. 9A is a cross-sectional view of the probe card of FIG. 9.

Probe cards need not be limited to a single device described herein to compensate for thermally induced motion according to the present invention. Indeed, the present invention contemplates the combination two or more of the devices previously described in a single probe card. The example shown in FIG. 9 employs a tester side energy transmissive device 470, a wafer side energy transmissive device 475, a lubricating layer 792 to allow for radial motion of the probe card 110, and a bi-material stiffening element 580. Other combinations using two or more of the previously described devices to compensate for thermally induced motion in probe cards are also contemplated. Preferably any probe card incorporating two or more of the above-described devices would also include a control means capable of controlling all of the devices incorporated, but the present invention also contemplates utilizing individual control means or no control means in any particular probe card.

While the invention has been illustrated and described in detail in the drawings and foregoing description, the same is to be considered as illustrative and not restrictive in character, it being understood that only the preferred embodiment have been shown and described and that all changes and modifications that come within the spirit of the invention are desired to be protected. The articles "a", "an", "said" and "the" are not limited to a singular element, and include one or more such element.

What is claimed is:

1. In combination:

a probe card for testing die on a wafer;

a shape memory alloy element connected to said probe card;

wherein said shape memory alloy utilizes thermal energy to deflect a portion of said probe card to control the geometric shape of said probe card.

2. The combination of claim 1 wherein said shape memory alloy element is located at least partially generally along a surface of said probe card.

3. The combination of claim 1 wherein said shape memory alloy element comprises and alloy of nickel and titanium.

4. The combination of claim 1 and further including at least one strain sensor located near said shape memory alloy element for monitoring strain corresponding to deflection of said probe card.

5. The combination of claim 1 comprising at least a first shape memory element and a second shape memory element oriented generally perpendicular to said first shape memory element.

6. The combination of claim 1 wherein said shape memory alloy includes at least a first shape memory element and a second shape memory element located generally on opposite top and bottom surfaces of said probe card.

7. The combination of claim 6 comprising at least a first shape memory element and a second shape memory element oriented generally perpendicular to said first shape memory element.

8. In combination:

a probe card for testing a die on a wafer; and, at least one strain sensor on said probe card for monitoring strain corresponding to deflection of said probe card, and further comprising a first shape memory alloy element on said probe card heatable in response to output from said strain sensor.

9. The combination of claim 8 and further including at least one strain sensor located near and oriented generally parallel to said first shape memory alloy element for monitoring strain corresponding to deflection of said probe card.

10. The combination of claim 8 wherein said strain sensor is oriented generally radially outward from a center portion of said probe card.

11. The combination of claim 8 wherein said strain sensor is oriented generally parallel with a peripheral edge of said probe card.

12. The combination of claim 8 comprising at least a first shape memory element and a second shape memory element oriented generally perpendicular to said first shape memory element.

13. The combination of claim 12 comprising at least a first shape memory element and a second shape memory element located generally on opposite top and bottom surfaces of said probe card.

14. The combination of claim 8 comprising a shape memory alloy element including at least a first shape memory element and a second shape memory element located generally on opposite top and bottom surfaces of said probe card and utilizing thermal energy in response to strain sensor output to deflect a portion of said probe card to control the geometric shape of said probe card.

* * * * *